US012812834B2

(12) United States Patent
Wang et al.

(10) Patent No.: US 12,812,834 B2
(45) Date of Patent: Nov. 24, 2026

(54) SRAM STRUCTURE WITH DUAL SIDE POWER RAILS

(71) Applicant: Taiwan Semiconductor Manufacturing Company, Ltd., Hsin-Chu (TW)

(72) Inventors: Ping-Wei Wang, Hsin-Chu (TW); Jui-Lin Chen, Taipei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 436 days.

(21) Appl. No.: 18/494,073

(22) Filed: Oct. 25, 2023

(65) Prior Publication Data

US 2024/0414906 A1 Dec. 12, 2024

Related U.S. Application Data

(60) Provisional application No. 63/506,666, filed on Jun. 7, 2023.

(51) Int. Cl.
*H10B 10/00* (2023.01)
*G11C 11/412* (2006.01)
(Continued)

(52) U.S. Cl.
CPC ............ *H10B 10/12* (2023.02); *G11C 11/412* (2013.01); *H10W 20/42* (2026.01); *H10W 20/427* (2026.01)

(58) Field of Classification Search
CPC ...... H10B 10/12; H10B 20/34; G11C 11/412; G11C 5/14; G11C 17/12; G11C 11/417; H10D 89/10; H10D 84/907; H10D 84/929; H10D 84/964; H10D 84/981; H10D 30/43; H10D 84/85; H10D 30/014; H10D 30/019;
(Continued)

(56) References Cited

U.S. PATENT DOCUMENTS 8,605,523 B2 12/2013 Tao et al.
8,630,132 B2 1/2014 Cheng et al.
(Continued)

FOREIGN PATENT DOCUMENTS

TW 202201803 A 1/2022
TW 202205287 A 1/2022
TW 202230692 A 8/2022

*Primary Examiner* — Mouloucoulaye Inoussa
(74) *Attorney, Agent, or Firm* — HAYNES AND BOONE, LLP

(57) ABSTRACT

A memory cell includes first and second active regions and first and second gate structures. The first gate structure engages the first active region in forming a first transistor. The second gate structure engages the second active region in forming a second transistor. The first and second transistors have a same conductivity type. The memory cell further includes a first epitaxial feature on a source region of the first transistor, a second epitaxial feature on a source region of the second transistor, a first frontside contact directly above and in electrical coupling with the first epitaxial feature, a second frontside contact directly above and in electrical coupling with the second epitaxial feature, and a first backside via directly under and in electrical coupling with one of the first and second epitaxial features with another one of the first and second epitaxial features free of a backside via directly thereunder.

20 Claims, 21 Drawing Sheets

(51) Int. Cl.
*H10W 20/41* (2026.01)
*H10W 20/42* (2026.01)

(58) Field of Classification Search
CPC ............... H10D 30/501; H10D 30/658; H10D 30/6735; H10D 30/6757; H10D 62/121; H10D 64/017; H10D 84/013; H10D 84/0151; H10D 84/017; H10D 84/038; H10W 20/42; H10W 20/427; H10W 20/20; H10W 20/069; H10P 14/27
See application file for complete search history.

(56) References Cited

U.S. PATENT DOCUMENTS

| | | | | |
|---|---|---|---|---|
| 8,760,948 | B2 | 6/2014 | Tao et al. | |
| 11,328,750 | B1* | 5/2022 | Amirante | G11C 5/14 |
| 2014/0032871 | A1 | 1/2014 | Hsu et al. | |
| 2014/0153321 | A1 | 6/2014 | Liaw | |
| 2014/0153345 | A1 | 6/2014 | Kim et al. | |
| 2014/0177352 | A1 | 6/2014 | Lum | |
| 2014/0233330 | A1 | 8/2014 | Ko et al. | |
| 2014/0241077 | A1 | 8/2014 | Katoch et al. | |
| 2014/0269114 | A1 | 9/2014 | Yang et al. | |
| 2017/0352598 | A1* | 12/2017 | Lee | H10D 86/01 |
| 2021/0028112 | A1* | 1/2021 | Kim | H10D 86/215 |
| 2021/0035975 | A1* | 2/2021 | Kim | H10D 64/017 |
| 2021/0343332 | A1* | 11/2021 | Chiu | G11C 11/412 |
| 2021/0375883 | A1* | 12/2021 | Hsu | H10B 10/12 |
| 2021/0407999 | A1* | 12/2021 | Huang | H10D 30/43 |
| 2021/0408247 | A1* | 12/2021 | Yu | H10D 30/6729 |
| 2022/0059460 | A1* | 2/2022 | Do | H10W 20/427 |
| 2022/0059571 | A1* | 2/2022 | Baek | H10D 84/907 |
| 2022/0077062 | A1* | 3/2022 | Van Dal | H10D 84/85 |
| 2022/0165848 | A1* | 5/2022 | Lin | H10D 64/017 |
| 2022/0173103 | A1* | 6/2022 | Kim | H10D 84/85 |
| 2022/0231013 | A1* | 7/2022 | Hong | H10D 84/038 |
| 2022/0328657 | A1* | 10/2022 | Lu | H10D 62/021 |
| 2022/0352352 | A1* | 11/2022 | Huang | H10D 30/024 |
| 2022/0384570 | A1* | 12/2022 | Liu | H10D 62/115 |
| 2022/0415904 | A1* | 12/2022 | Sharma | H10B 12/05 |
| 2023/0012680 | A1* | 1/2023 | Liaw | H10B 10/125 |
| 2023/0068280 | A1* | 3/2023 | Lin | H10D 89/10 |
| 2023/0120499 | A1 | 4/2023 | Yu et al. | |
| 2023/0223455 | A1* | 7/2023 | Liaw | H10D 30/6735 257/288 |
| 2023/0317851 | A1* | 10/2023 | Sharma | H10D 30/43 257/351 |
| 2024/0121933 | A1* | 4/2024 | Tsutsui | H10B 10/125 |
| 2024/0332294 | A1* | 10/2024 | Xie | H10D 30/43 |

* cited by examiner

SRAM STRUCTURE WITH DUAL SIDE POWER RAILS

PRIORITY DATA

This application claims priority to U.S. Provisional Patent Application No. 63/506,666 filed on Jun. 7, 2023, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In deep sub-micron integrated circuit technology, static random-access memory (SRAM) device has become a popular storage unit of high-speed communication, image processing, and system-on-chip (SOC) products. The amount of embedded SRAM devices in microprocessors and SOCs increases to meet the performance requirement in new technology generations. As silicon technology continues to scale from one generation to the next, conventional SRAM devices and/or the fabrication thereof may encounter limitations. For example, aggressive scaling down of IC dimensions has resulted in densely spaced source/drain features and gate structures, and densely spaced source/drain contacts and gate vias formed thereover. In some SRAM devices, multilayer interconnect structure providing metal lines for interconnecting power lines and signal lines in and between memory cells of the SRAM devices are formed over source/drain contacts and gate vias of the transistors of the memory cells. With ever-decreasing device sizes and densely spaced transistors, some metal lines (e.g., metal lines for power routings) are formed to have reduced dimensions, which may lead to increased parasitic resistance, increased parasitic capacitance, high process risk, and/or poor connection, which may degrade the speed of the memory devices. All those issues present performance, yield, and cost challenges. Therefore, while existing SRAM devices may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
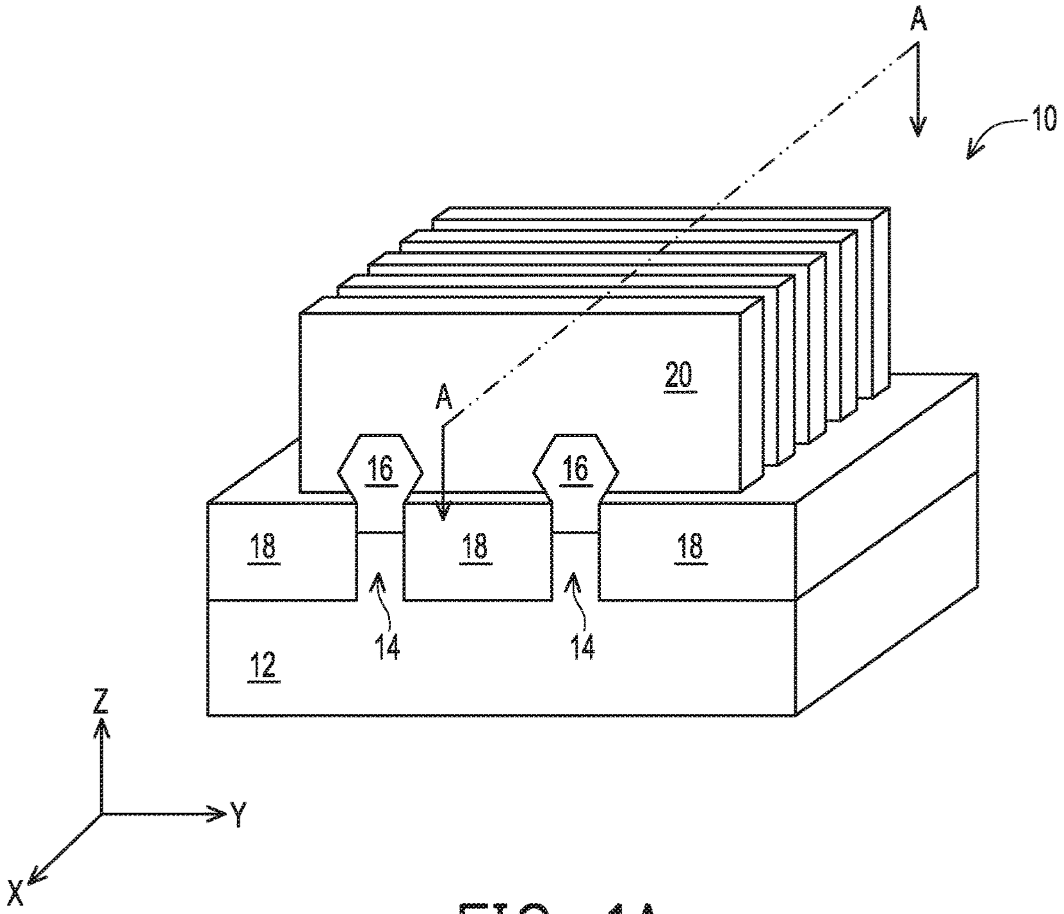
FIGS. 1A and 1B illustrate a perspective view and a top view of a portion of a memory device, respectively, in accordance with some embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure provides various embodiments of a memory device. Particularly, the present disclosure provides various embodiments of a static-random-access memory (SRAM) device structure with dual side power rails (i.e., power rails formed on both frontside and backside of SRAM cells) with a reduced backside via density. In the scheme of a reduced backside via density, some of the source regions of the transistors in the SRAM cells may not have corresponding backside vias to directly tap to the backside power rail, but still electrically couple to the backside power rail indirectly through interconnections with neighboring source regions having corresponding backside vias that directly tap to the backside power rail. By sparing some of the backside vias, the number of backside via is reduced, and the pitch among backside vias is increased which enlarges process windows. Further, the cost of masks for manufacturing backside interconnect structures is also reduced.

SRAM is an electronic data storage device implemented on a semiconductor-based integrated circuit and generally has much faster access times than other types of data storage technologies. SRAM is popular in high-speed communication, image processing and system-on-chip (SOC) applications. A bit can be read from or written into an SRAM cell within a few nanoseconds. An SRAM cell include transistors with metal interconnect structures above the transistors. The metal interconnect structures include metal lines for interconnecting transistor gates and source/drain regions, such as signal lines for routing bit line and word line signals to the cell components, as well as power rails (such as metal lines for power voltage and electrical ground) for providing power to the cell components. Contacts and respective contact vias electrically connect the cell components to the signal lines and the power rails. For example, some of the source/drain regions in an SRAM cell are coupled to a power voltage VDD (also referred to as VCC) and/or an electrical ground VSS through source/drain contacts, source/drain contact vias, and respective metal lines in the power rails. Source/drain region(s) may refer to a source or a drain, individually or collectively dependent upon the context.

Conventionally, SRAM devices are built in a stacked-up fashion, having transistors at the lowest level and interconnect structures (contacts, vias, and metal lines) on top of the transistors to provide connectivity to the transistors. Power rails are also above the transistors and may be part of the interconnect structures. With the increasing downscaling of SRAM devices, so do the power rails. As available layout area becomes limited and metal lines in the power rails are generally formed to have reduced dimensions. This inevitably leads to increased voltage drop across the power rails, as well as increased power consumption, which has become a key issue in further boosting performance of SRAM devices. Therefore, although existing approaches in semiconductor fabrication have been generally adequate for their intended purposes, they have not been entirely satisfactory in all respects in the context of SRAM devices. One area of interest is how to form power rails and vias on the backside of SRAM cells to reduce overall power routing resistance. The power rails formed on both the frontside and backside of SRAM cells are referred to as dual side power rails.

Some exemplary embodiments are related to, but not otherwise limited to, multi-gate devices. Multi-gate devices have been introduced in an effort to improve gate control by increasing gate-channel coupling, reduce OFF-state current, and reduce short-channel effects (SCEs). One such multi-gate device that has been introduced is the fin-like field-effect transistor (FinFET). The FinFET gets its name from the fin-like structure which extends from a substrate on which it is formed, and which is used to form the FET channel. Another multi-gate device, introduced in part to address performance challenges associated with the FinFET, is the gate-all-around (GAA) transistor. The GAA transistor gets its name from the gate structure which can extend around the channel region (e.g., a stack of nanosheets) providing access to the channel on four sides. The GAA transistor is compatible with conventional complementary metal-oxide-semiconductor (CMOS) processes and its structure allows it to be aggressively scaled while maintaining gate control and mitigating SCEs. The following disclosure will continue with one or more GAA examples to illustrate various embodiments of the present disclosure. It is understood, however, that the application should not be limited to a particular type of device, except as specifically claimed. For example, aspects of the present disclosure may also apply to implementation based on FinFETs or planar FETs.

The details of the device structures of the present disclosure are described in the attached drawings. The drawings have outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

Figure 1B:
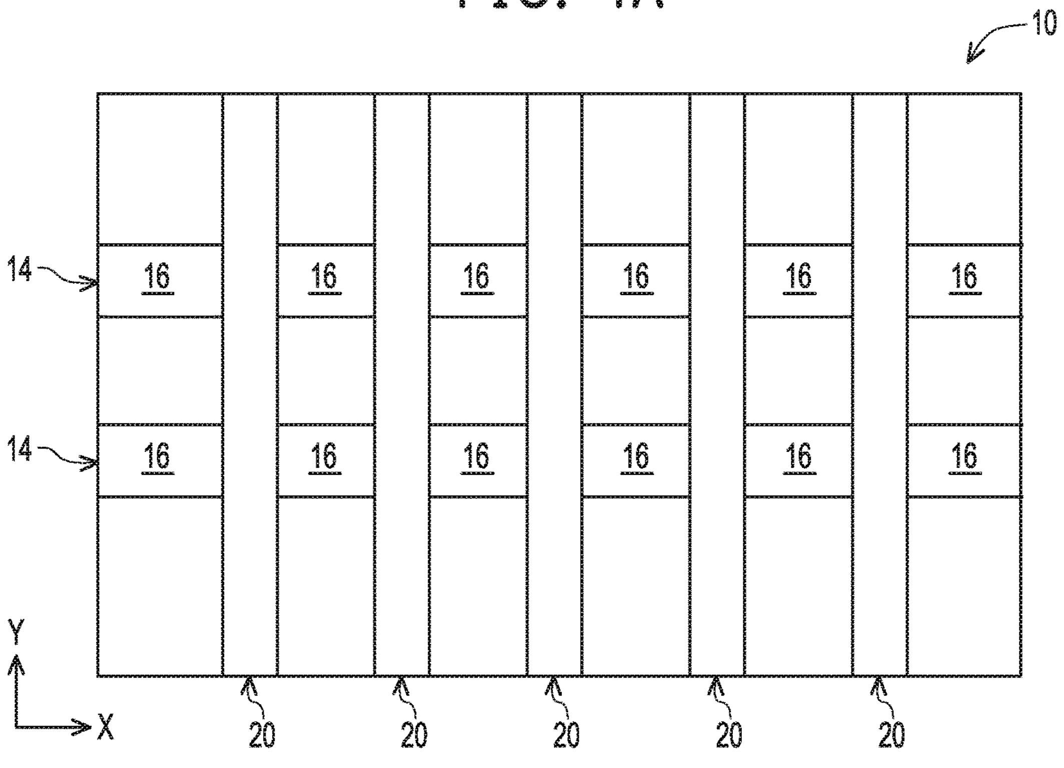

FIGS. 1A and 1B illustrate a perspective view and a top view, respectively, of a portion of an Integrated Circuit (IC) device 10, such as an SRAM device, that is implemented using multi-gate transistors, such as GAA transistors. Referring to FIG. 1A, the IC device 10 includes a substrate 12. The substrate 12 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 12 may be a single-layer material having a uniform composition. Alternatively, the substrate 12 may include multiple material layers having similar or different compositions suitable for IC device manufacturing. In one example, the substrate 12 may be a silicon-on-insulator (SOI) substrate having a semiconductor silicon layer formed on a silicon oxide layer. In another example, the substrate 12 may include a conductive layer, a semiconductor layer, a dielectric layer, other layers, or combinations thereof. Various doped regions, such as source/drain regions, may be formed in or on the substrate 12. The doped regions may be doped with n-type dopants, such as phosphorus or arsenic, and/or p-type dopants, such as boron, depending on design requirements. The doped regions may be formed directly on the substrate 12, in a p-well structure, in an n-well structure, in a dual-well structure, or using a raised structure. Doped regions may be formed by implantation of dopant atoms, in-situ doped epitaxial growth, and/or other suitable techniques.

Figure 2:
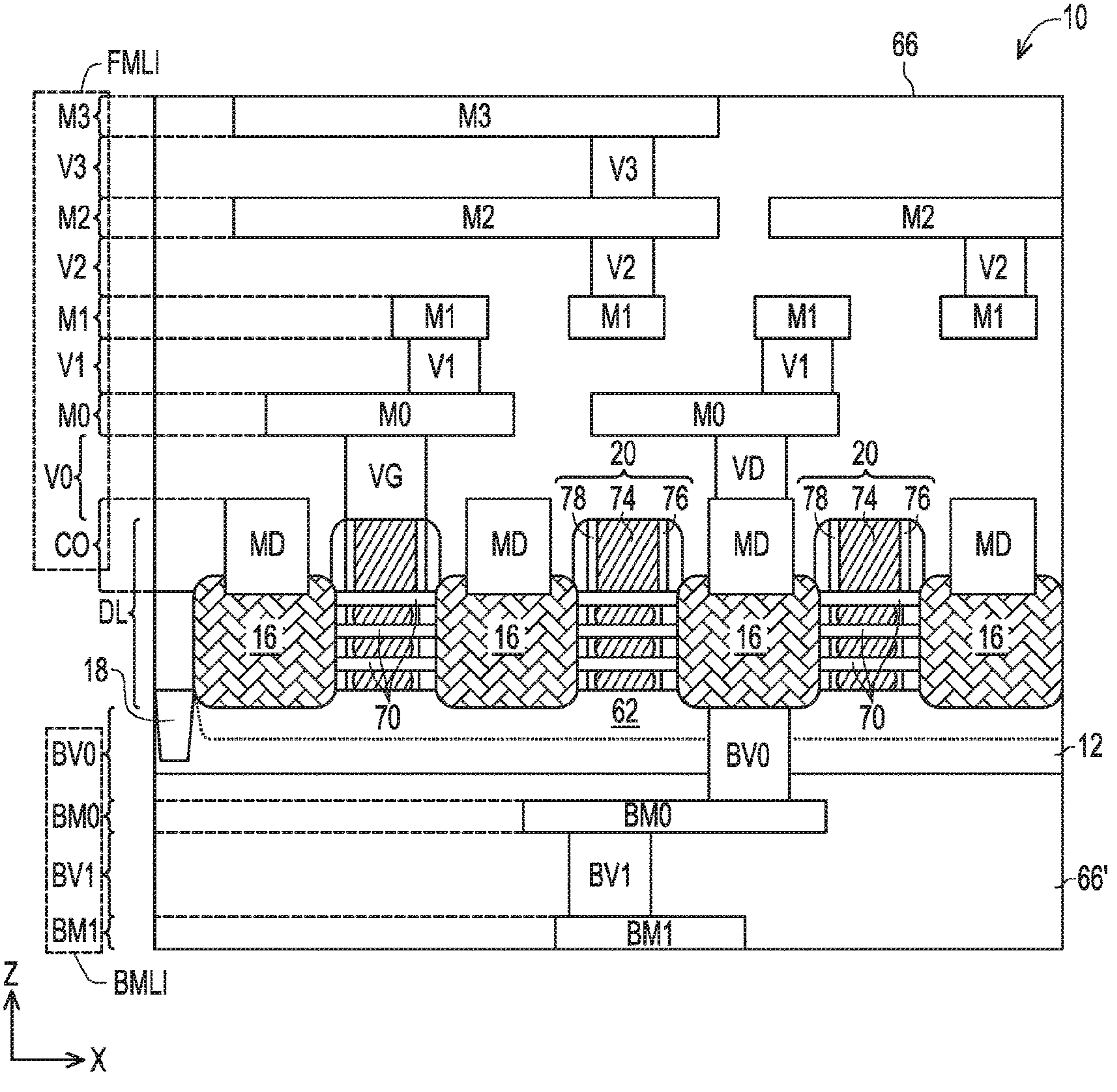
FIG. 2 illustrates a cross-sectional view of various layers of a memory device, in accordance with some embodiments of the present disclosure.

Three-dimensional active regions 14 are formed on the substrate 12. An active region for a transistor refers to the area where a source region, a drain region, and a channel region under a gate structure of the transistor are formed. An active region is also referred to as an "oxide-definition (OD) region" in the context. Each of the active regions 14 includes elongated nanostructures 70 (as shown in FIG. 2) vertically stacked in channel regions defined in the active region and above a fin-shape base. The fin-shape base protrudes upwardly out of the substrate 12. Source/drain features 16 are formed in source/drain regions defined in the active region and over the fin-shape base. The source/drain features 16 abut two opposing ends of the nanostructures 70. The source/drain features 16 may include epi-layers that are epitaxially grown on the fin-shape base.

The IC device 10 further includes isolation structures (or isolation features) 18 formed over the substrate 12. The isolation structures 18 electrically separate various components of the IC device 10. The isolation structures 18 may include silicon oxide, silicon nitride, silicon oxynitride, fluoride-doped silicate glass (FSG), a low-k dielectric material, and/or other suitable materials. In some embodiments, the isolation structures 18 may include shallow trench isolation (STI) features. In one embodiment, the isolation structures 18 are formed by etching trenches in the substrate 12 during the formation of the active regions 14. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 18. Alternatively, the isolation structures 18 may include a multi-layer structure, for example, having one or more thermal oxide liner layers.

The IC device 10 also includes gate structures (or gate stacks) 20 formed over and engaging channel regions in the active regions 14. The gate structures 20 may be dummy gate structures (e.g., containing an oxide gate dielectric and a polysilicon gate electrode), or they may be high-k metal gate (HKMG) structures that contain a high-k gate dielectric and a metal gate electrode, where the HKMG structures are formed by replacing the dummy gate structures. Though not depicted herein, the gate structures 20 may include additional material layers, such as an interfacial layer, a capping layer, other suitable layers, or combinations thereof.

Referring to FIG. 1B, multiple active regions 14 are oriented lengthwise along the X-direction, and multiple gate structures 20 are oriented lengthwise along the Y-direction, i.e., generally perpendicular to the active regions 14. At intersections of the active regions 14 and the gate structures 20, transistors are formed. In many embodiments, the IC device 10 includes additional features such as gate spacers disposed along sidewalls of the gate structures 20, and numerous other features.

FIG. 2 is a fragmentary diagrammatic cross-sectional view of various layers (levels) that can be fabricated over and under a semiconductor substrate (or wafer) to form a portion of a memory device, such as IC chip 10 of FIGS. 1A and 1B, according to various aspects of the present disclosure. As represented in FIG. 2, the various layers include a device layer DL, a frontside multilayer interconnect structure FMLI disposed over the device layer DL, and a backside multilayer interconnect structure BMLI disposed under the device layer DL.

Device layer DL includes devices (e.g., transistors, resistors, capacitors, and/or inductors) and/or device components (e.g., doped wells, gate structures, and/or source/drain features). In embodiments represented by FIG. 2, the device layer DL includes substrate 12, doped regions 62 (e.g., n-wells and/or p-wells) disposed in substrate 12, isolation feature 18, and transistors T. In the depicted embodiment, transistors T include suspended channel layers (nanostructures) 70 and gate structures 20 disposed between source/drain features 16, where gate structures 20 wrap and/or surround suspended channel layers 70. Each gate structure 20 has a metal gate stack formed from a gate electrode 74 disposed over a gate dielectric layer 76 and gate spacers 78 disposed along sidewalls of the metal gate stack.

Multilayer interconnect structures FMLI and BMLI electrically couple various devices and/or components of device layer DL, such that the various devices and/or components can operate as specified by design requirements for the memory device. Each of the multilayer interconnect structures FMLI and BMLI may include one or more interconnect layers. In the depicted embodiment, the multilayer interconnect structure FMLI includes a contact interconnect layer (CO level), a via zero interconnect layer (V0 level), a metal zero interconnect layer (M0 level), a via one interconnect layer (V1 level), a metal one interconnect layer (M1 level), a via two interconnect layer (V2 level), a metal two interconnect layer (M2 level), a via three interconnect layer (V3 level), and a metal three interconnect layer (M3 level). Each of the CO level, V0 level, M0 level, V1 level, M1 level, V2 Level, M2 level, V3 level, and M3 level may be referred to as a metal level. Metal lines formed at the M0 level may be referred to as M0 metal lines. Similarly, via or metal lines formed at the V1 level, M1 level, V2 level, M2 level, V3 level, and M3 level may be referred to as V1 vias, M1 metal lines, V2 vias, M2 metal lines, V3 vias, and M3 metal lines, respectively. The present disclosure contemplates multilayer interconnect structure FMLI having more or less interconnect layers and/or levels, for example, a total number of N interconnect layers (levels) of the multilayer interconnect structure FMLI with N as an integer ranging from 1 to 10. Each level of multilayer interconnect structure FMLI includes conductive features (e.g., metal lines, metal vias, and/or metal contacts) disposed in one or more dielectric layers (e.g., an interlayer dielectric (ILD) layer and an etch stop layer (ESL)). The dielectric layers of the multilayer interconnect structure FMLI are collectively referred to as a dielectric structure 66. In some embodiments, conductive features at a same level of multilayer interconnect structure FMLI, such as M0 level, are formed simultaneously. In some embodiments, conductive features at a same level of multilayer interconnect structure FMLI have top surfaces that are substantially planar with one another and/or bottom surfaces that are substantially planar with one another.

In embodiments represented by FIG. 2, the CO level includes source/drain contacts MD disposed in the dielectric structure 66. The source/drain contacts MD may be formed on and in direct contact with silicide layers disposed directly on the source/drain features 16. The V0 level includes gate vias VG disposed on the gate structures and source/drain contact vias VD disposed on the source/drain contacts MD, where gate vias VG connect gate structures to M0 metal lines, source/drain vias V0 connect source/drain contacts MD to M0 metal lines. In some embodiments, the V0 level may also include butted contacts disposed in the dielectric structure 66. The V1 level includes V1 vias disposed in the dielectric structure 66, where V1 vias connect M0 metal lines to M1 metal lines. M1 level includes M1 metal lines disposed in the dielectric structure 66. V2 level includes V2 vias disposed in the dielectric structure 66, where V2 vias connect M1 metal lines to M2 metal lines. M2 level includes M2 metal lines disposed in the dielectric structure 66. V3 level includes V3 vias disposed in the dielectric structure 66, where V3 vias connect M2 metal lines to M3 metal lines.

In the depicted embodiment, the multilayer interconnect structure BMLI includes a backside via zero interconnect layer (BV0 level), a backside metal zero level (BM0 level), a backside via one interconnect layer (BV1 level) and a backside metal one interconnect layer (BM1 level). Each of the BV0 level, BM0 level, BV1 level, and BM1 level may be referred to as a metal level. Metal lines formed at the BM0 level may be referred to as BM0 metal lines. Similarly, via or metal lines formed at the BV0 level, BV1 level, and BM1 level may be referred to as BV0 vias, BV1 vias, and BM1 metal lines, respectively. The present disclosure contemplates multilayer interconnect structure BMLI having more or less interconnect layers and/or levels, for example, a total number of M interconnect layers (levels) of the multilayer interconnect structure BMLI with M as an integer ranging from 1 to 10. Each level of multilayer interconnect structure BMLI includes conductive features (e.g., metal lines, metal vias, and/or metal contacts) disposed in one or more dielectric layers (e.g., an interlayer dielectric (ILD) layer and an etch stop layer (ESL)). The dielectric layers of the multilayer interconnect structure BMLI are collectively referred to as a backside dielectric structure 66'. In some embodiments, conductive features at a same level of multilayer interconnect structure BMLI, such as BM0 level, are formed simultaneously. In some embodiments, conductive features at a same level of multilayer interconnect structure BMLI have top surfaces that are substantially planar with one another and/or bottom surfaces that are substantially planar with one another.

In embodiments represented by FIG. 2, the BV0 level includes vias BV0 formed under the device layer DL. For example, the vias BV0 may include one or more backside source/drain vias formed directly under the source/drain features of the device layer DL and coupled to those source/drain features by way of a silicide layer. The vias BV0 may include one or more backside gate vias formed directly under and in direct contact with the gate structure(s) of the device layer DL. The BM0 level includes BM0 metal lines formed under the BV0 level. The backside gate vias connect gate structures to BM0 metal lines, and the backside source/drain vias connect source/drain features to BM0 metal lines. The BV1 level includes BV1 vias disposed in the backside dielectric structure 66', where BV1 vias connect BM0 metal lines to BM1 metal lines. The BM1 level includes BM1 metal lines formed under the BV1 level.

FIG. 2 has been simplified for the sake of clarity to better understand the inventive concepts of the present disclosure. Additional features can be added in the various layers of the memory, and some of the features described can be replaced, modified, or eliminated in other embodiments of the memory. FIG. 2 is merely an example and may not reflect an actual cross-sectional view of the IC chip 10 and/or the SRAM cells 100 that are described in further detail below.

Figure 3:
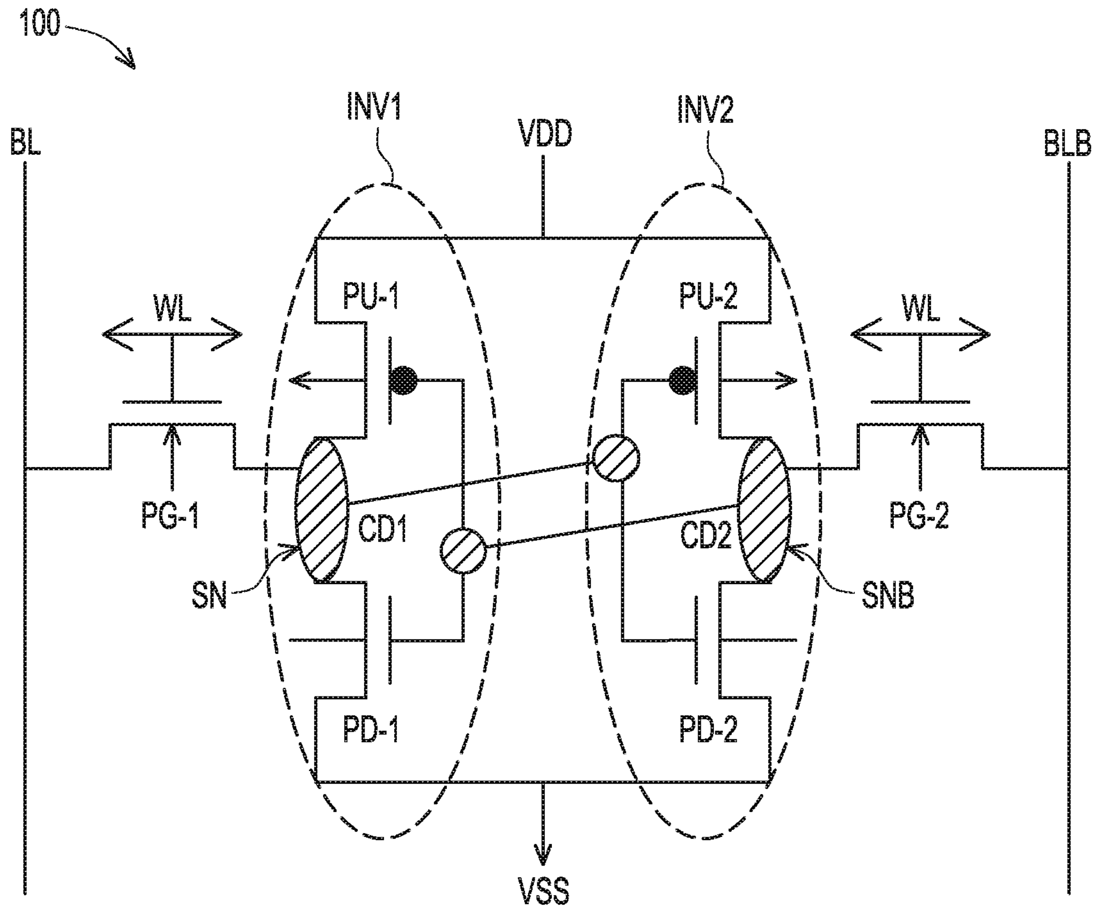
FIG. 3 illustrates a circuit schematic of a static random-access memory (SRAM) cell, in accordance with some embodiments of the present disclosure.

Referring now to FIG. 3, an example circuit schematic for an SRAM cell 100 is shown. The SRAM cell 100 includes two inverters cross-coupled together to store a bit of data and further includes a pass gate electrically connected to the two inverters for reading from and write into the SRAM cell. FIG. 3 has been simplified for the sake of clarity to better understand the inventive concepts of the present disclosure. Additional features can be added in the SRAM cell 100, and some of the features described below can be replaced, modified, or eliminated in other embodiments of the SRAM cell 100.

The exemplary SRAM cell 100 includes six transistors: a pass-gate transistor PG-1, a pass-gate transistor PG-2, a pull-up transistor PU-1, a pull-up transistor PU-2, a pull-down transistor PD-1, and a pull-down transistor PD-1. The exemplary SRAM cell 100 is thus referred to as a 6-transistor (6-T) SRAM cell. The 6-T SRAM cell is used for illustration and to explain the features, but does not limit the embodiments or the appended claims. This non-limiting embodiment may be further extended to an 8-T SRAM cell, a 10-T SRAM cell, and to content addressable memory (CAM) cells.

Further, the exemplary SRAM cell 100 is a single-port SRAM cell that includes a write-port, which is used for illustration and to explain the features, but does not limit the embodiments or the appended claims. This non-limiting embodiment may be further extended to a multi-port SRAM cell, such as a two-port SRAM cell that includes a write-port and a read-port.

In operation, the pass-gate transistors PG-1, PG-2 provide access to a storage portion of the SRAM cell 100, which includes a cross-coupled pair of inverters, a first inverter INV1 and a second inverter INV2. The first inverter INV1 includes the pull-up transistor PU-1 and the pull-down transistor PD-1, and the second inverter INV2 includes the pull-up transistor PU-2 and the pull-down transistor PD-2.

A gate of the pull-up transistor PU-1 interposes a source (electrically coupled with a power voltage line or referred to as a VDD line) and a first common drain (CD1), and a gate of the pull-down transistor PD-1 interposes a source (electrically coupled with an electrical ground line or referred to as a VSS line) and the first common drain (CD1). A gate of the pull-up transistor PU-2 interposes a source (electrically coupled with the VDD line) and a second common drain (CD2), and a gate of the pull-down transistor PD-2 interposes a source (electrically coupled with the VSS line) and the second common drain (CD2). In some implementations, the first common drain (CD1) is a storage node (SN) that stores data in true form, and the second common drain (CD2) is a storage node (SNB) that stores data in complementary form. The gate of the pull-up transistor PU-1 and the gate of the pull-down transistor PD-1 are coupled with the second common drain (CD2), and the gate of the pull-up transistor PU-2 and the gate of the pull-down transistor PD-2 are coupled with the first common drain (CD1). A gate of the pass-gate transistor PG-1 interposes a source (electrically coupled with a bit line BL) and a drain, which is electrically coupled with the first common drain (CD1). A gate of the pass-gate transistor PG-2 interposes a source (electrically coupled with a complementary bit line BLB) and a drain, which is electrically coupled with the second common drain (CD2). The gates of the pass-gate transistors PG-1, PG-2 are electrically coupled with a word line WL. In some implementations, pass-gate transistors PG-1, PG-2 provide access to storage nodes SN, SNB during read operations and/or write operations. For example, the pass-gate transistors PG-1, PG-2 couple storage nodes SN, SNB respectively to bit lines BL, BLB in response to voltage applied to the gates of pass-gate transistors PG-1, PG-2 by the word lines WLs.

When the SRAM cell 100 is read from, a positive voltage is placed on the word line WL, and the pass gate transistors PG-1 and PG-2 allow the bit lines BL and BLB to be coupled to, and receive the data from, the storage nodes SN and SNB. Unlike a dynamic memory or DRAM cell, a SRAM cell does not lose its stored state during a read, so no data "write back" operation is required after a read. The bit lines BL and BLB form a complementary pair of data lines. As is known to those skilled in the art, these paired data lines may be coupled to a differential sense amplifier (not shown); and the differential voltage read from SRAM cells can be sensed and amplified. The amplified sensed signal, which is at a logic level voltage, may then be output as read data to other logic circuitry in the device.

In some embodiments, the pull-up transistors PU-1, PU-2 are configured as p-type field-effect transistors (PFETs), and the pull-down transistors PD-1, PD-2 are configured as n-type filed-effect transistors (NFETs). In some implementations, the pass-gate transistors PG-1, PG-2 are also configured as NFETs. Various NFETs and PFETs may be formed by any proper technology, such as fin-like FETs (FinFETs) or gate-all-around (GAA) FETs.

Figure 4A:
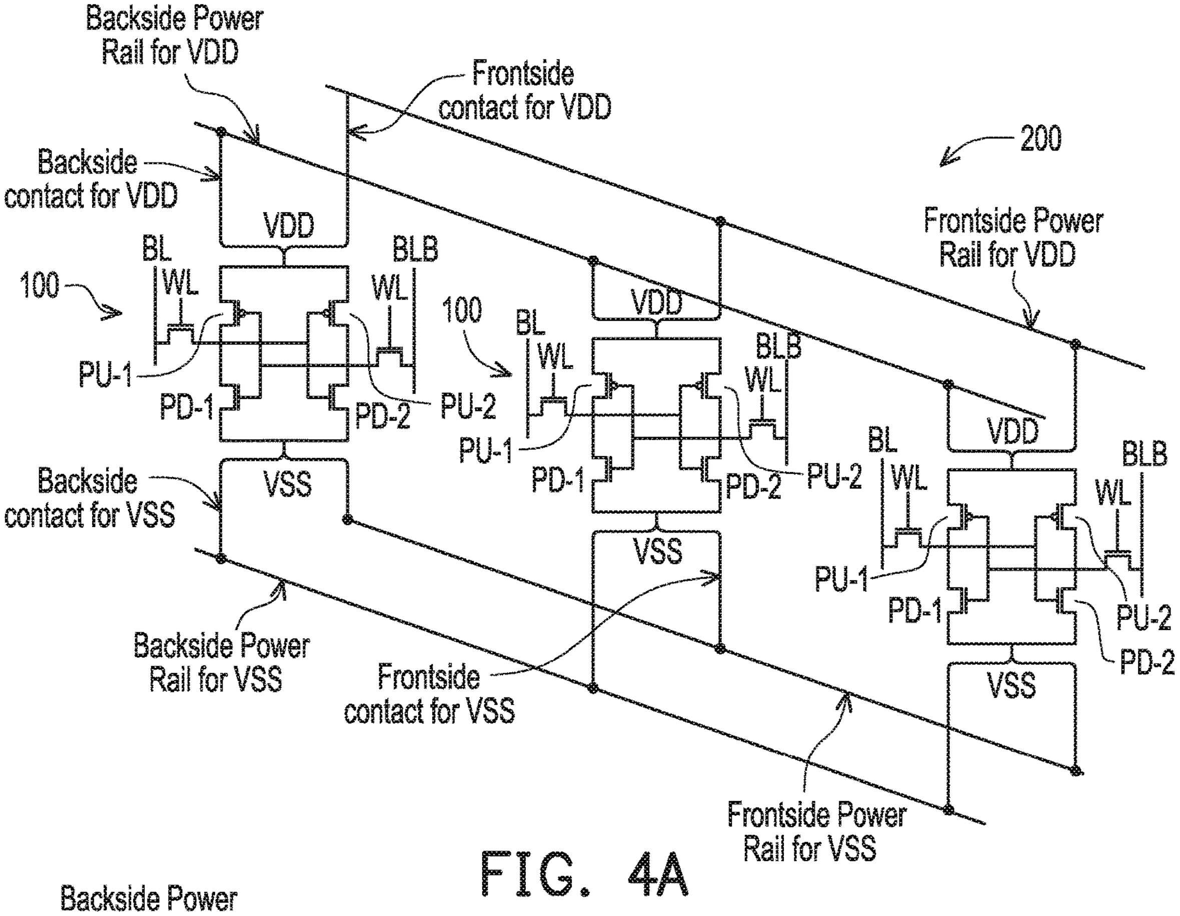
FIGS. 4A and 4B illustrate circuit schematics of frontside and backside power routings for multiple SRAM cells in an array, in accordance with some embodiments of the present disclosure.
Figure 4B:
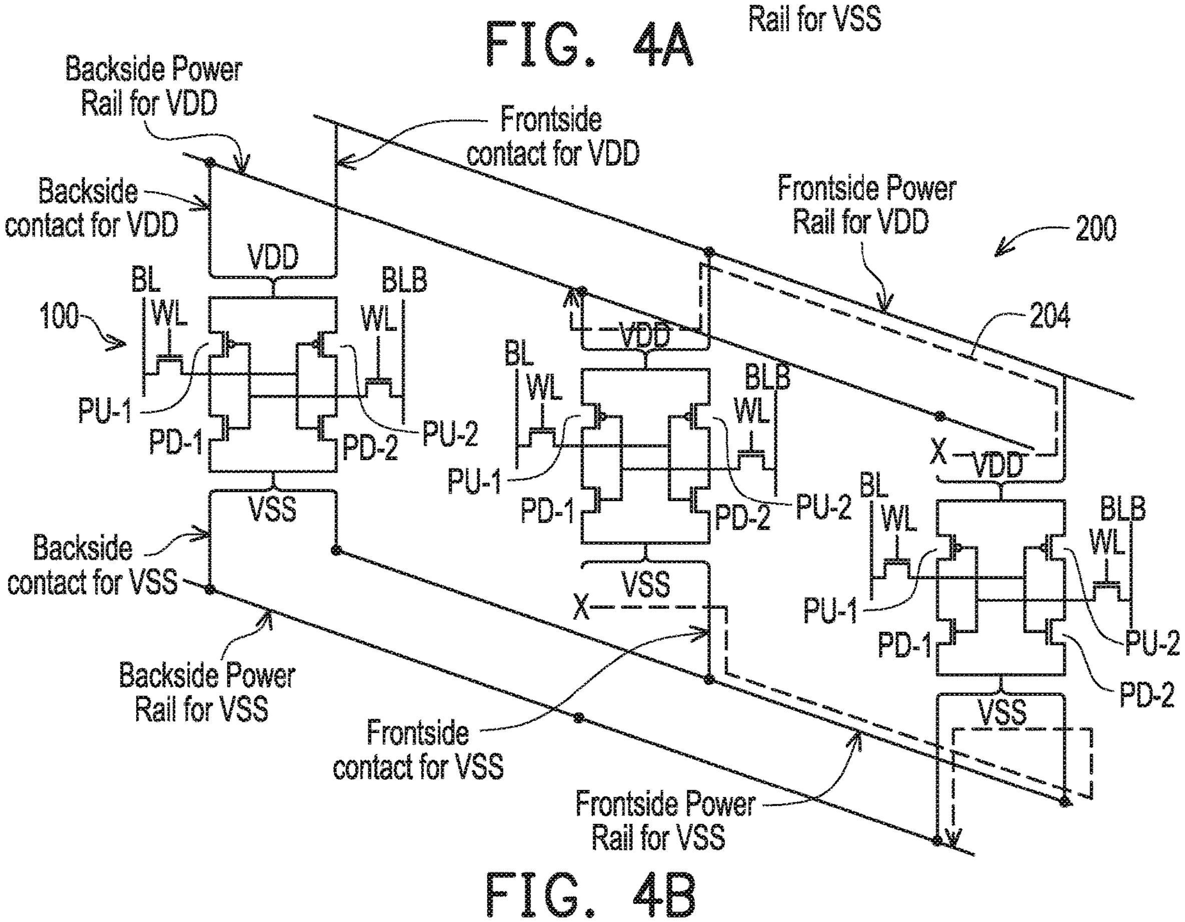

FIGS. 4A and 4B illustrate circuit schematics of a portion of an SRAM array 200 with dual side power rails in accordance with two embodiments of the present disclosure. The illustrated portion of the SRAM array 200 includes three SRAM cells 100 which may be from a column or a row of the SRAM array 200. The present disclosure contemplates a column or a row of the SRAM array 200 having more or less SRAM cells 100. In FIG. 4A, the VDD node of each SRAM cell 100 is connected to the frontside power rail for VDD through frontside contacts (or referred to as frontside source/drain contacts, or simply as source/drain contacts) for VDD and connected to the backside power rail for VDD through backside contacts (or referred to as backside vias, or as backside source/drain contacts) for VDD; the VSS node of each SRAM cell 100 is connected to the frontside power rail for VSS through frontside contacts for VSS and connected to the backside power rail for VSS through backside contacts (or referred to as backside vias) for VSS.

As a comparison, in FIG. 4B, some backside contacts for VDD and/or backside contacts for VSS are intentionally not formed to reduce backside via density. For example, the SRAM cell 100 positioned in the middle does not have a backside contact for VSS (marked by a "X" in FIG. 4B). Nonetheless, the source regions of the pull-down transistors PD-1 and PD-2 of the SRAM cell 100 positioned in the middle still electrically couple to the backside power rail for VSS through some electrical coupling paths. One exemplary electrical coupling path is represented by a broken line 202, which is through the frontside contact for VSS, the frontside power rail for VSS, the frontside contact for VSS of an adjacent SRAM cell 100, the source regions of the pull-down transistors PD-1 and PD-2 of the adjacent SRAM cell 100, the backside contact for VSS, and the backside power rail for VSS. Similarly, the SRAM cell 100 positioned in the right does not have a backside contact for VDD (marked by another "X" in FIG. 4B). Nonetheless, the source regions of the pull-up transistors PU-1 and PU-2 of the SRAM cell 100 positioned in the right still electrically couple to the backside power rail for VDD through some electrical coupling paths. One exemplary electrical coupling path is represented by a broken line 204, which is through the frontside contact for VDD, the frontside power rail for VDD, the frontside contact for VDD of an adjacent SRAM cell 100, the source regions of the pull-up transistors PU-1 and PU-2 of the adjacent SRAM cell 100, the backside contact for VDD, and the backside power rail for VDD. Therefore, the functionality of the SRAM cells 100 is not affected with a reduced number of backside vias, and the power routing resistance is not substantially increased by sharing backside vias among neighboring SRAM cells.

Notably, in FIGS. 4A and 4B, the frontside power rails include the frontside power rail for VDD and the frontside power rail for VSS, and the backside power rails include the backside power rail for VDD and the backside power rail for VSS. The present disclosure contemplates other configurations. In one configuration, the frontside power rails include the frontside power rail for VDD and the frontside power rail for VSS, and the backside power rails include the backside power rail for VDD but no backside power rail for VSS. In another configuration, the frontside power rails include the frontside power rail for VDD and the frontside power rail for VSS, and the backside power rails include the backside power rail for VSS but no backside power rail for VDD. In yet another configuration, the frontside power rails include the frontside power rail for VDD but no frontside power rails for VSS, and the backside power rails include the backside power rail for VSS but no backside power rail for VDD. In any of the above configurations, some of the backside vias can be omitted to reduce the backside via density, and the remaining backside vias are shared among neighboring SRAM cells.

Figure 5:
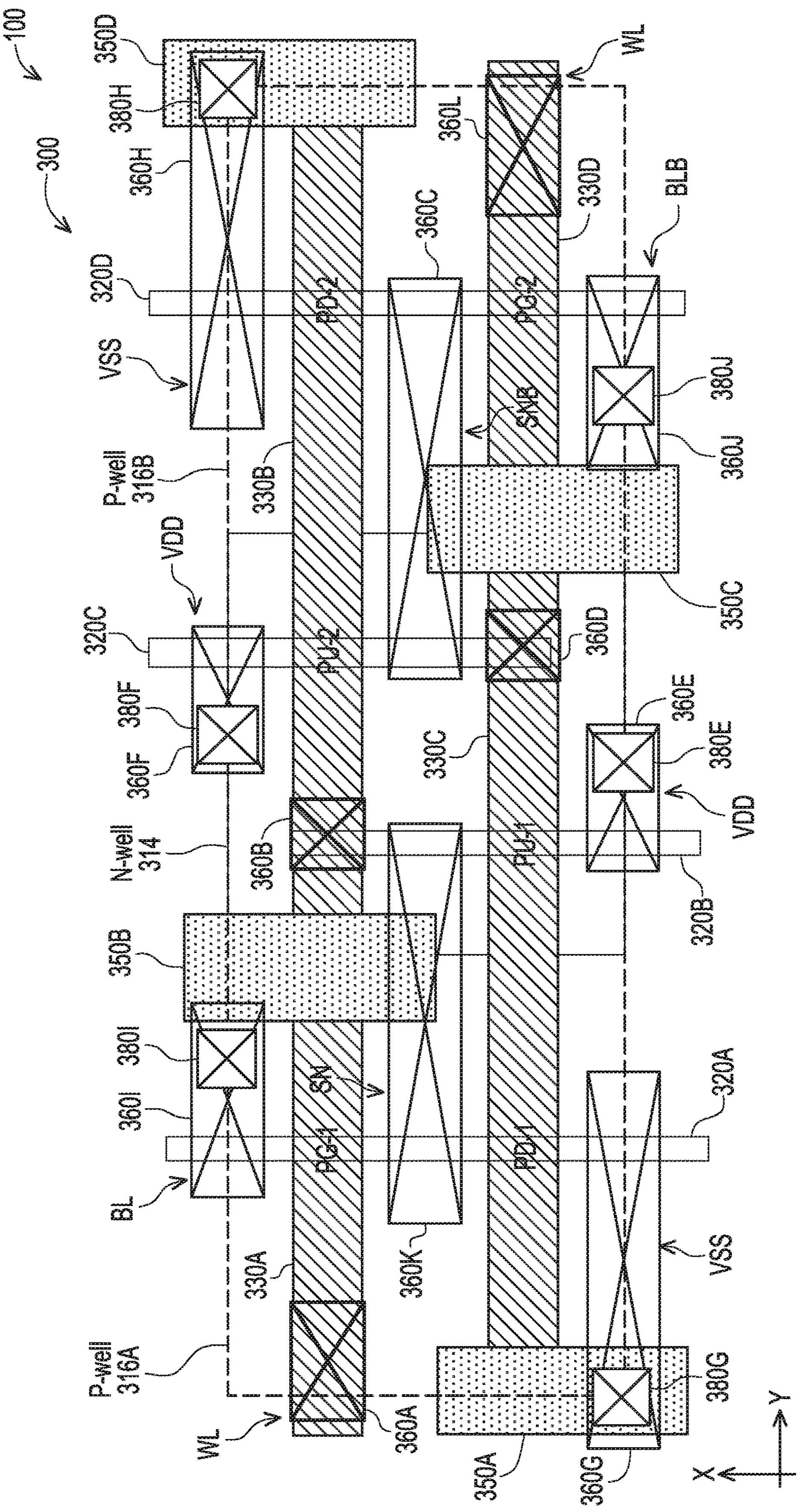
FIG. 5 illustrates a layout of the SRAM cell as in FIG. 3, in accordance with some embodiments of the present disclosure.

FIG. 5 illustrates a layout 300 of the SRAM cell 100 (represented by the dashed box), of which the circuit diagram is shown in FIG. 3, according to various aspects of the present disclosure. FIG. 5 has been simplified for the sake of clarity to better understand the inventive concepts of the present disclosure. For example, for convenience of illustration, the simplified layout 300 shown in FIG. 5 illustrates, among other features, a layout of wells, active regions, gate structures, source/drain contacts formed on source/drain regions, gate contacts formed on gate structures, and gate isolation features in cut-metal-gate (CMG) trenches that "cut" an otherwise continuous gate structure into multiple segments. Source/drain region(s) may refer to a source or a drain, individually or collectively dependent upon the context. One of ordinary skill in the art should also understand that for the purpose of illustration, FIG. 5 only shows one exemplary configuration of a layout of a 6-T SRAM bit cell. Additional features can be added in the layout 300, and some of the features described below can be replaced, modified, or eliminated corresponding to other embodiments of the SRAM cell 100.

Still referring to FIG. 5, the SRAM cell 100 includes six transistors: a pass-gate transistor PG-1, a pass-gate transistor PG-2, a pull-up transistor PU-1, a pull-up transistor PU-2, a pull-down transistor PD-1, and a pull-down transistor PD-1. The layout 300 thus represents a layout of a 6-T SRAM cell. The SRAM cell 100 includes a region 314 that provides an n-well between a region 316A and a region 316B that each provides a p-well (collectively as region 316). The pull-up transistors PU-1, PU-2 are disposed over the region 314; the pull-down transistor PD-1 and the pass-gate transistor PG-1 are disposed over the region 316A; and the pull-down transistor PD-2 and the pass-gate transistor PG-2 are disposed over the region 316B. In some implementations, the pull-up transistors PU-1, PU-2 are configured as PFETs, and the pull-down transistors PD-1, PD-2 and the pass-gate transistors PG-1, PG-2 are configured as NFETs.

Each of the transistors PG-1, PG-2, PU-1, PU-2, PD-1, and PD-2 includes an active region. In the illustrated embodiment, the SRAM cell 100 includes active regions 320A, 320B, 320C, and 320D (collectively, as the active regions 320) disposed over a semiconductor substrate. The active regions 320 are extending lengthwise in the X-direction and oriented substantially parallel to one another. In some implementations, the active regions 320 are a portion of the semiconductor substrate (such as a portion of a material layer of the semiconductor substrate). For example, where the semiconductor substrate includes silicon, the active regions 320 include fins and project upwardly and continuously from the semiconductor substrate, and the transistors PG-1, PG-2, PU-1, PU-2, PD-1, and PD-2 are FinFET transistors. Alternatively, in some implementations, the active regions 320 are defined in one or more semiconductor material layers, overlying the semiconductor substrate. For example, the active regions 320 can include a stack of nanostructures (nanowires or nanosheets) vertically stacked over the semiconductor substrate, and the transistors PG-1, PG-2, PU-1, PU-2, PD-1, and PD-2 are GAA transistors.

Various gate structures (or referred to as gate stacks, or simply as gates) are disposed over the active regions 320, such as gate structures 330A, 330B, 330C, and 330D (collectively, as the gate structures 330). The gate structures 330 extend lengthwise along the Y-direction (for example, substantially perpendicular to the active regions 320). The gate structures 330 wrap at least portions of the active regions 320, positioned such that the gate structures interpose respective source/drain regions of the active regions 320. The gate structure 330A is disposed over the active region 320A; the gate structure 330C is disposed over the active regions 320A, 320B, 320C; the gate structure 330B is disposed over the active regions 320B, 320C, 320D; and the gate structure 330D is disposed over the active region 320D. A gate of the pass-gate transistor PG-1 is formed from the gate structure 330A, a gate of the pull-down transistor PD-1 is formed from the gate structure 330C, a gate of the pull-up transistor PU-1 is formed from the gate structure 330C, a gate of the pull-up transistor PU-2 is formed from the gate structure 330B, a gate of the pull-down transistor PD-2 is formed from the gate structure 330B, and a gate of the pass-gate transistor PG-2 is formed from the gate structure 330D.

A gate contact 360A electrically connects a gate of the pass-gate transistor PG-1 (formed by gate structure 330A) to a word line WL (generally referred to as a word line node WL), and a gate contact 360L electrically connects a gate of the pass-gate transistor PG-2 (formed by gate structure 330D) to the word line WL. A source/drain contact 360K electrically connects a drain region of the pull-down transistor PD-1 (formed on the active region 320A (which may include n-type epitaxial source/drain features)) and a drain region of the pull-up transistor PU-1 (formed on the active region 320B (which may include p-type epitaxial source/drain features)), such that a common drain of pull-down transistor PD-1 and pull-up transistor PU-1 form a storage node SN. A gate contact 360B electrically connects a gate of the pull-up transistor PU-2 (formed by gate structure 330B) and a gate of the pull-down transistor PD-2 (also formed by gate structure 330B) to the storage node SN. A source/drain contact 360C electrically connects a drain region of the pull-down transistor PD-2 (formed on the active region 320D (which may include n-type epitaxial source/drain features)) and a drain region of the pull-up transistor PU-2 (formed on the active region 320C (which may include p-type epitaxial source/drain features)), such that a common drain of pull-down transistor PD-2 and pull-up transistor PU-2 form a storage node SNB. A gate contact 360D electrically connects a gate of the pull-up transistor PU-1 (formed by the gate structure 330C) and a gate of the pull-down transistor PD-1 (also formed by the gate structure 330C) to the storage node SNB.

A source/drain contact 360E and a source/drain contact via 380E landing thereon electrically connects a source region of pull-up transistor PU-1 (formed on the active region 320B (which can include p-type epitaxial source/drain features)) to a power supply voltage VDD, and a source/drain contact 360F and a source/drain contact via 380F landing thereon electrically connects a source region of the pull-up transistor PU-2 (formed on the active region 320C (which may include p-type epitaxial source/drain features)) to the power supply voltage VDD. A source/drain contact 360G and a source/drain contact via 380G landing thereon electrically connects a source region of the pull-down transistor PD-1 (formed on the active region 320A (which may include n-type epitaxial source/drain features)) to a grounding voltage VSS, and a source/drain contact 360H and a source/drain contact via 380H electrically connects a source region of the pull-down transistor PD-2 (formed on the active region 320D (which may include n-type epitaxial source/drain features)) to the grounding voltage VSS. The source/drain contact 360G, source/drain contact via 380G, the source/drain contact 360H, and source/drain contact via 380H may be device-level contacts and contact vias that are shared by adjacent SRAM cells 100 (e.g., four SRAM cells 100 abutting at a same corner may share one source/drain contact 360G and one source/drain contact via 380G landing thereon). A source/drain contact 360I electrically connects a source region of the pass-gate transistor PG-1 (formed on the fin 320A (which may include n-type epitaxial source/drain features)) to a bit line BL, and a source/drain contact 360J electrically connects a source region of the pass-gate transistor PG-2 (formed on the fin 320D (which may include n-type epitaxial source/drain features)) to a complementary bit line BLB. In the context, a source/drain contact electrically connecting to a source region may also be referred to as a source contact, and a source/drain contact electrically connecting to a drain region may also be referred to as a drain contact.

Still referring to FIG. 5, the SRAM cell 100 further includes a plurality of dielectric features extending lengthwise along the X-direction, including dielectric features 350A, 350B, 350C, and 350D (collectively, dielectric features 350 or referred to as isolation features 350). In the illustrated embodiment, the dielectric feature 350B is disposed between the active region 320A and the active region 320B and abuts the gate structure 330A and the gate structure 330B. The dielectric feature 350B divides an otherwise continuous gate structure into two isolated segments corresponding to the gate structure 330A and the gate structure 330B. The dielectric feature 350C is disposed between the active region 320C and the active region 320D and abuts the gate structure 330C and the gate structure 330D. The dielectric feature 350C divides an otherwise continuous gate structure into two isolated segments corresponding to the gate structure 330C and the gate structure 330D. The dielectric feature 350A is disposed near an edge of the SRAM cell 100 and abuts the gate structure 330C. The dielectric feature 350A divides the gate structure 330C from adjoining other gate structure from an adjacent SRAM cell. The dielectric feature 350D is disposed near another edge of the SRAM cell 100 and abuts the gate structure 330B. The dielectric feature 350D divides gate structure 330B from adjoining other gate structure from an adjacent SRAM cell. Each of the dielectric features 350 is formed by filling a corresponding CMG trench in the position of the dielectric features. The dielectric features 350 are also referred to as CMG features.

In the illustrated embodiment, from a top view, the CMG feature 350B is disposed above an interface between the n-well region 314 and the p-well region 316A, the CMG feature 350C is disposed above an interface between the n-well region 314 and the p-well region 316B, the CMG feature 350A is disposed completely above a p-well region that includes the p-well region 316A, and the CMG feature 350D is disposed completely above a p-well region that includes the p-well region 316B.

Figure 6:
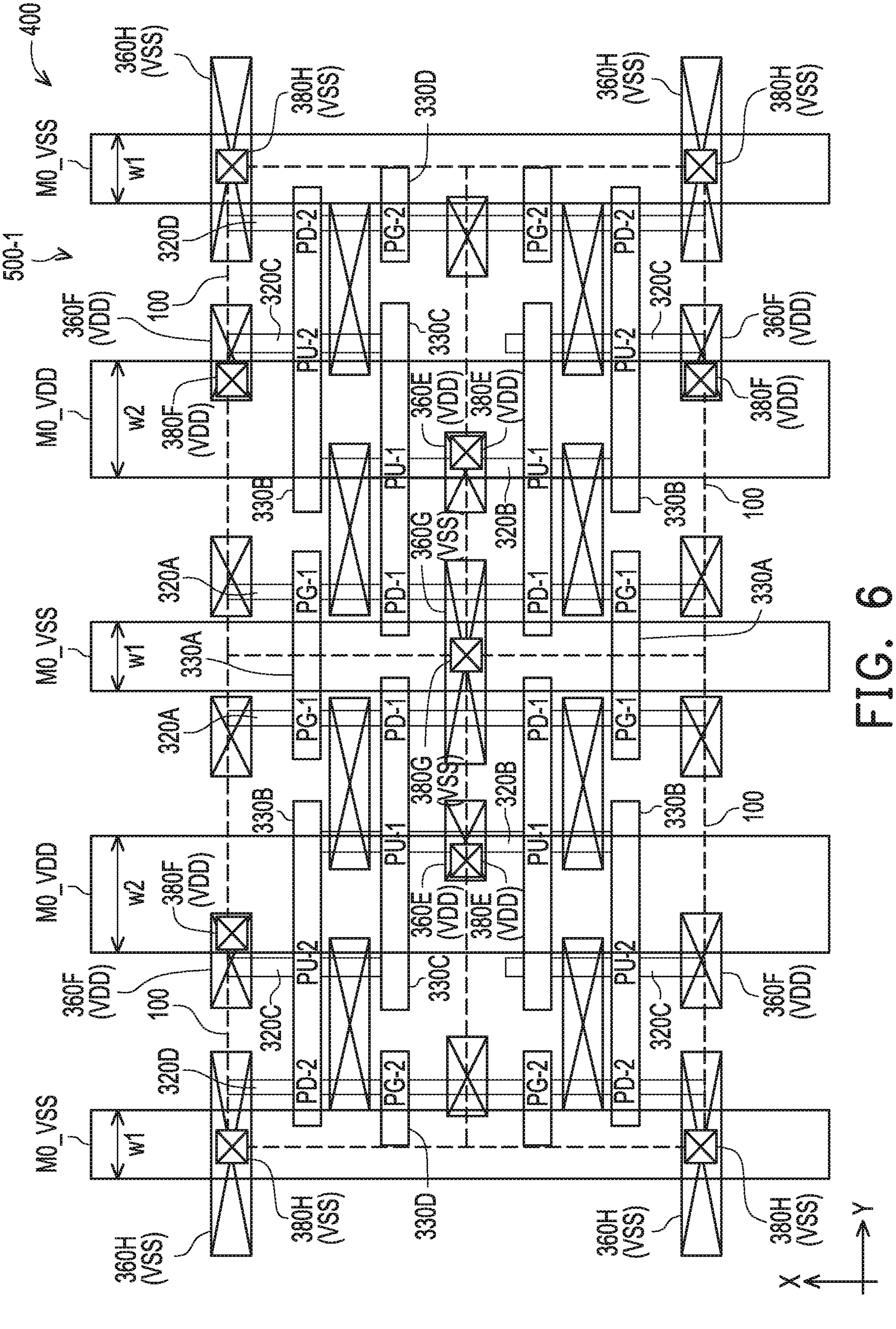
FIG. 6 illustrates a layout of frontside features of a 2×2 SRAM array, in accordance with some embodiments of the present disclosure.

FIG. 6 illustrates a diagrammatic layout 500-1 of a portion of the device layer DL and the frontside multilayer interconnect structure FMLI of an SRAM array 400 according to the present disclosure. Referring to FIG. 6, four SRAM cells are arranged in the X-direction and the Y-direction, forming a 2×2 array of SRAM cells. Each SRAM cell in the array may use the layout of the SRAM cell 100 as depicted in FIG. 5. In the illustrated embodiment, two adjacent SRAM cells in the X-direction are line symmetric with respect to a common boundary therebetween, and two adjacent SRAM cells in the Y-direction are line symmetric with respect to a common boundary therebetween. FIG. 6 has been simplified for reasons of visual clarity and to better understand the inventive concepts of the present disclosure. For example, some features including well regions, CMG features, and gate contacts depicted in FIG. 5 are omitted. Also, reference numerals in FIG. 5 are repeated in FIG. 6 for ease of understanding, yet reference numerals for those source/drain contacts and source/drain contact vias not intended for power routings (e.g., intended for signal routings) are omitted.

For ease of reference, a column is referred to as being in the X-direction of an array, and a row is referred to as being in the Y-direction of an array. As depicted above, adjacent cells in the array are mirror images along a common boundary between the adjacent cells. Some active regions in an SRAM cell may extend through multiple SRAM cells in a column. In FIG. 6, the active region 320A for the transistors PG-1 and PD-1 in one SRAM cell extends into the abutting SRAM cell as the active region for the transistors PD-1 and PG-1 in the abutting SRAM cell. The active region 320B for the transistor PU-1 in one SRAM cell extends into the abutting SRAM cell as the active region for the transistor PU-1 in the abutting SRAM cell. The active region 320D for the transistors PG-2 and PD-2 in one SRAM cell extends into the abutting SRAM cell as the active region for the transistors PD-2 and PG-2 in the abutting SRAM cell. Similarly, some gate structures can be shared by multiple SRAM cells in a row without being interrupted by a CMG feature. For example, the gate structure 330A for the transistor PG-1 in one SRAM cell extends into the abutting SRAM cell as the gate structure for the transistor PG-1 in the abutting SRAM cell. The gate structure 330D for the transistor PG-2 in one SRAM cell extends into the abutting SRAM cell as the gate structure for the transistor PG-2 in the abutting SRAM cell. The spacing between active regions along the Y-direction and the spacing between gate structures along the X-direction can be uniform. This configuration can improve the uniformity of an array layout.

The contacts 360 disposed at boundaries of the SRAM cells may also be shared by adjacent SRAM cells. In the illustrated embodiment, the source/drain contact 360G extends into corners regions of four neighboring SRAM cells and is shared by these four SRAM cells. Therefore, the source/drain contact 360G and the source/drain contact via 380G landing thereon tie the VSS nodes of the four neighboring SRAM cells together. Similarly, the source/drain contact 360H is shared by four respective neighboring SRAM cells. Therefore, the source/drain contact 360H and the source/drain contact via 380H landing thereon tie the VSS nodes of the four respective neighboring SRAM cells together. The source/drain contact 360E is shared by two respective neighboring SRAM cells. Therefore, the source/drain contact 360E and the source/drain contact via 380E landing thereon tie the VDD nodes of the two respective neighboring SRAM cells together. Similarly, the source/drain contact 360F is shared by two respective neighboring SRAM cells. Therefore, the source/drain contact 360F and the source/drain contact via 380F landing thereon tie the VDD nodes of the two respective neighboring SRAM cells together.

FIG. 6 also depicts some of the M0 metal lines as a part of the frontside power rails, including a plurality of VDD lines (denoted as M0_VDD) and a plurality of VSS lines (denoted as M0_VSS), while other M0 metal lines not intended for power routings (e.g., intended for signal routings) are omitted for reasons of visual clarity. Each of the metal lines M0_VDD and M0_VSS is a global metal line extending lengthwise in the X-direction through the array and shared by multiple SRAM cells in the same column. The metal lines M0_VDD and M0_VSS are alternatively arranged and spaced apart along the Y-direction. A spacing between adjacent metal lines M0_VDD and M0_VSS may be uniform. The metal lines M0_VSS have a width w1, and the metal lines M0_VDD have a width w2. In the illustrated embodiment, the width w2 is larger than the width w1. The source/drain contact vias 380H in the same column physically connects the respective source/drain contacts 360H in the same column to one of the metal lines M0_VSS. Thus, the source regions of the pull-down transistors PD-2 in the same column electrically couple to the metal line M0_VSS through the respective source/drain contacts 360H and the source/drain contact vias 380H in the same column. The source/drain contact vias 380G in the same column physically connects the respective source/drain contacts 360G in the same column to another one of the metal lines M0_VSS. Thus, the source regions of the pull-down transistors PD-1 in the same column electrically couples to the other metal line M0_VSS through the respective source/drain contacts 360G and the source/drain contact vias 380G in the same column. The source/drain contact vias 380E and 380F in the same column physically connects the respective source/drain contacts 360E and 360F in the same column to one of the metal lines M0_VDD. Thus, the source regions of the pull-up transistors PU-1 and PU-2 in the same column electrically couples to the metal line M0_VDD through the respective source/drain contacts 360E and 360F and the source/drain contact vias 380E and 380F in the same column, respectively.

In SRAM device design, the power rails and signal lines are not necessarily all formed on the frontside of the integrated circuit structure but may be distributed on both the frontside and backside of the integrated circuit structure. For example, the integrated circuit structure may include the frontside multilayer interconnect structure FMLI and the backside multilayer interconnect structure (BMLI) disposed on the frontside and backside of the integrated circuit structure respectively and configured to connect various components of the pull-up devices, pull-down devices, and pass-gate devices to form the SRAM cells. The configuration is designed with considerations of various factors and parameters, including sizes of various conductive features, packing density, resistance of the conductive features, parasitic capacitances among adjacent conductive features, overlay shifting and processing margins. In the following illustrated embodiments, the power rails and the signal lines are formed on the frontside of the SRAM device, while a portion of the power rails is also formed on the backside of the SRAM device. Thus, the power rails are formed on both the frontside and backside of the SRAM device as the dual side power rails.

Figure 7:
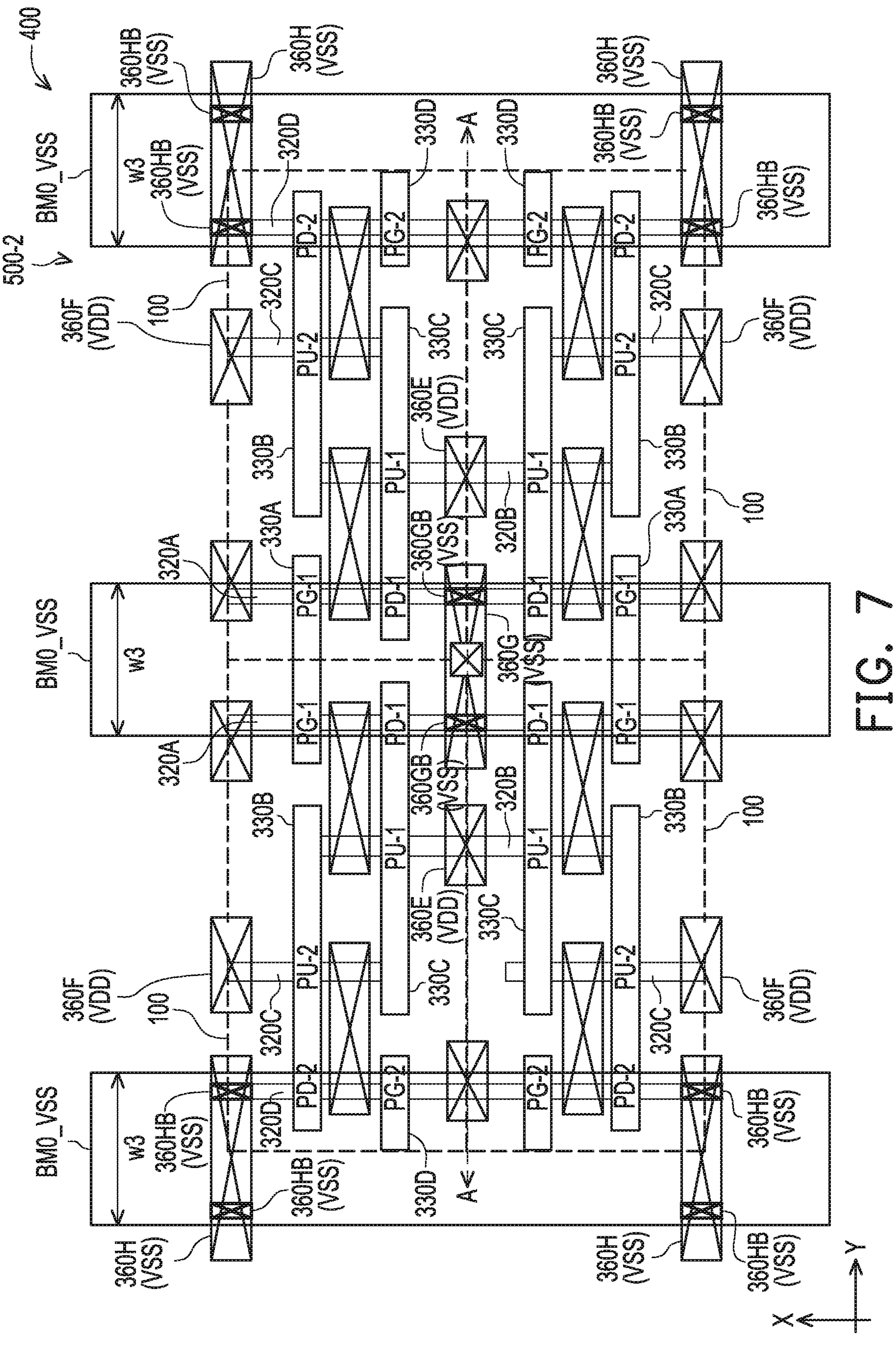
FIGS. 7, 8, and 9 illustrate layouts of backside features of a 2×2 SRAM array, in accordance with some embodiments of the present disclosure.

Reference is now made to FIG. 7. FIG. 7 illustrates a diagrammatic layout 500-2 of a portion of the backside multilayer interconnect structure BMLI of the SRAM array 400, which includes a backside via zero level (BV0 level) and a backside metal zero level (BM0 level). For reasons of visual clarity and to better understand the inventive concepts of the present disclosure, active regions, gate structures, and source/drain contacts as depicted in FIG. 6, which are at the frontside of the SRAM array 400, are overlaying on the layout 500-2. Yet, source/drain contact vias 380 as depicted in FIG. 6, which are a part of the frontside multilayer interconnect structure FMLI, are omitted in FIG. 7. Notably, the backside multilayer interconnect structure BMLI as depicted in FIG. 7 has only the backside power rail for VSS but no backside power rail for VDD. Alternatively, various other embodiments of the backside multilayer interconnect structure BMLI may include one or both of the backside power rail for VSS and the backside power rail for VDD.

The BV0 level includes backside vias (or referred to as backside source/drain contacts) 360GB and 360HB. The backside vias 360GB and 360HB can be considered as counterparts of the frontside source/drain contacts 360G and 360H, respectively. Similar to functions of the frontside source/drain contacts 360G and 360H, the backside vias 360GB and 360HB electrically couple the source regions of the pull-down transistors PD-1 and PD-2 to the electrical ground VSS. The backside vias 360GB and 360HB may have the same dimension along the Y-direction as the active regions 320A and 320D, respectively. This is due to one exemplary backside manufacturing flow in which the backside vias is formed by etching a fin-shape base in an active region from the backside to form a backside trench and filling the backside trench with conductive materials. Therefore, the backside vias inherit the width of the active region. In the illustrated embodiments, since each of the frontside source/drain contacts 360G and 360H crosses two neighboring active regions along the Y-direction, each of the frontside source/drain contacts 360G and 360H has two corresponding backside vias 360GB and 360HB formed on the backside of the two neighboring active regions, respectively. Therefore, in the depicted embodiment as in FIG. 7, a number of the backside vias electrically coupled to the electrical ground VSS is twice of a number of the frontside source/drain contacts electrically coupled to the electrical ground VSS.

The BM0 level includes a plurality of backside VSS lines (denoted as BM0_VSS) in parallel. A spacing between adjacent metal lines BM0_VSS may be uniform. Each of the metal lines BM0_VSS is a global metal line extending lengthwise in the X-direction through the array and shared by multiple SRAM cells in the same column. The metal lines BM0_VSS have a width w3. In some embodiments, the width w3 is larger than the width w1 of the M0_VSS metal lines due to the larger real estate available for power routings on the backside. In furtherance of some embodiments, the width w3 is even larger than the width w2 of the metal lines M0_VDD. Alternatively, the width w3 may be larger than the width w1 but equal to or small than the width w2.

Two backside vias 360GB of two neighboring SRAM cells physically connects the backsides of respective source regions of the pull-down transistors PD-1 in the two neighboring SRAM cells to one of the metal lines BM0_VSS. Thus, the source regions of the pull-down transistors PD-1 in the two neighboring SRAM cells electrically couple to the BM0_VSS metal line through the respective backside vias 360GB. The two backside vias 360HB in the same column physically connects backsides of respective source regions of the pull-down transistors PD-2 in the two neighboring SRAM cells to one of the metal lines BM0_VSS. Thus, the source regions of the pull-down transistors PD-2 in two neighboring SRAM cells electrically couple to the metal line BM0_VSS through the respective backside vias 360HB.

Figure 8:
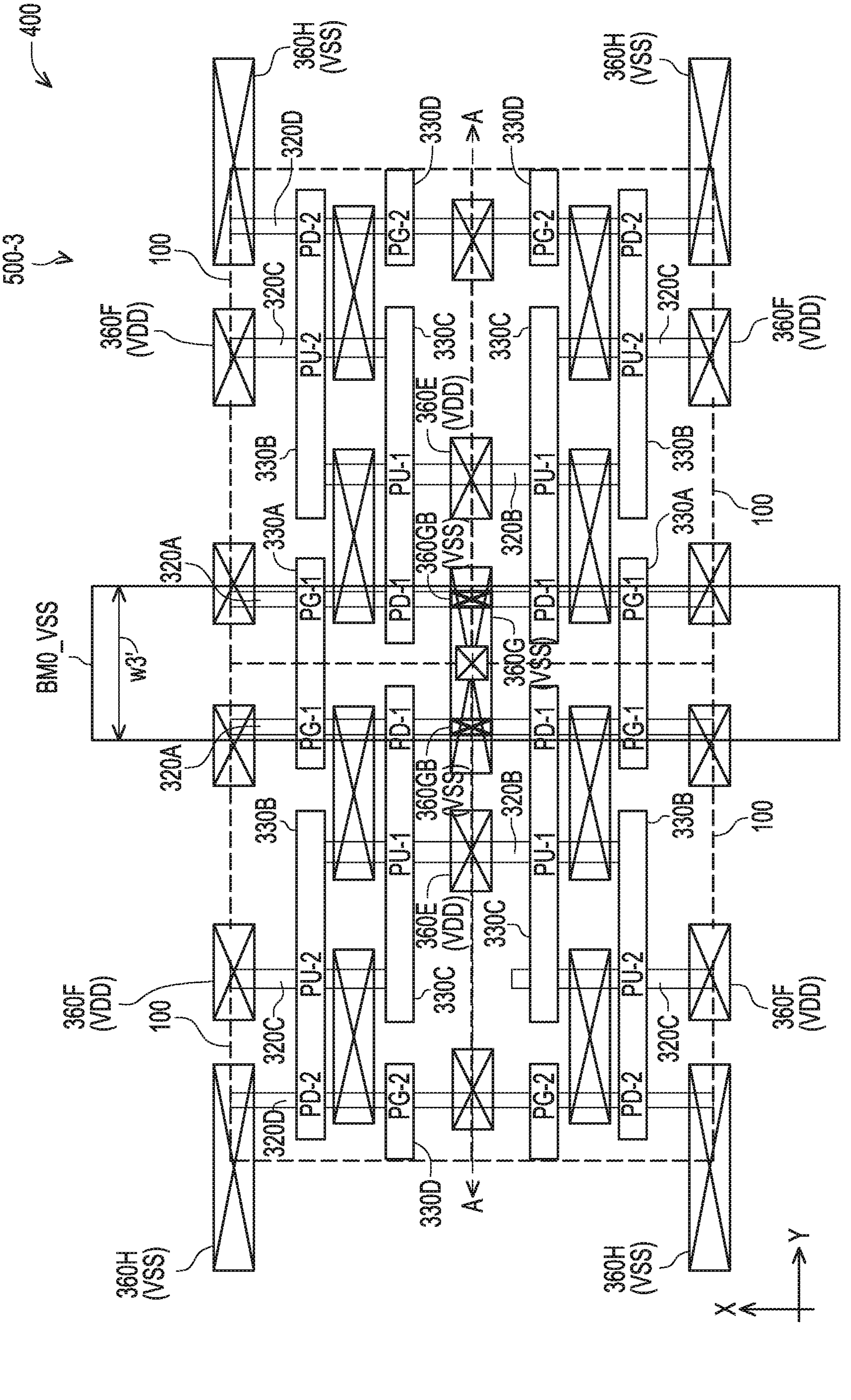

FIG. 8 illustrates a diagrammatic layout 500-3 of a portion of the backside multilayer interconnect structure BMLI of the SRAM array 400, which includes a backside via zero level (BV0 level) and a backside metal zero level (BM0 level). The layout 500-3 is an alternative of the layout 500-2 of FIG. 7. Many aspects of the layout 500-3 are similar to those of the layout 500-2, and the reference numerals are repeated for ease of understanding. One difference is that in the layout 500-3, some of the backside vias are not formed in the BV0 level. Particularly, there are no backside vias 360HB for the source regions of the pull-down transistors PD-2 in the layout 500-3, while the backside vias 360GB for the source regions of the pull-down transistors PD-1 still remain. As discussed above in association with FIG. 4B, even without the backside vias 360HB, the source regions of the pull-down transistors PD-2 still electrically couple to the backside power rail for VSS through an electrical coupling path that includes the frontside source/drain contacts 360H, the frontside power rail for VSS, the frontside source/drain contacts 360G, and the backside vias 360GB. This configuration reduces the amount of the backside vias for VSS in half, such that a number of the backside vias electrically coupled to the electrical ground VSS equals a number of the frontside source/drain contacts electrically coupled to the electrical ground VSS. As shown in FIG. 8, the number of the backside metal lines BM0_VSS is also reduced in half, such that the spacing between two neighboring backside metal lines BM0_VSS is increased. The larger spacing may allow the backside metal lines BM0_VSS to have an even larger width w3' (w3'>w3) to further reduce power rail resistance. Such a configuration of a reduced backside via density reduces mask costs and increases backside process windows.

Figure 9:
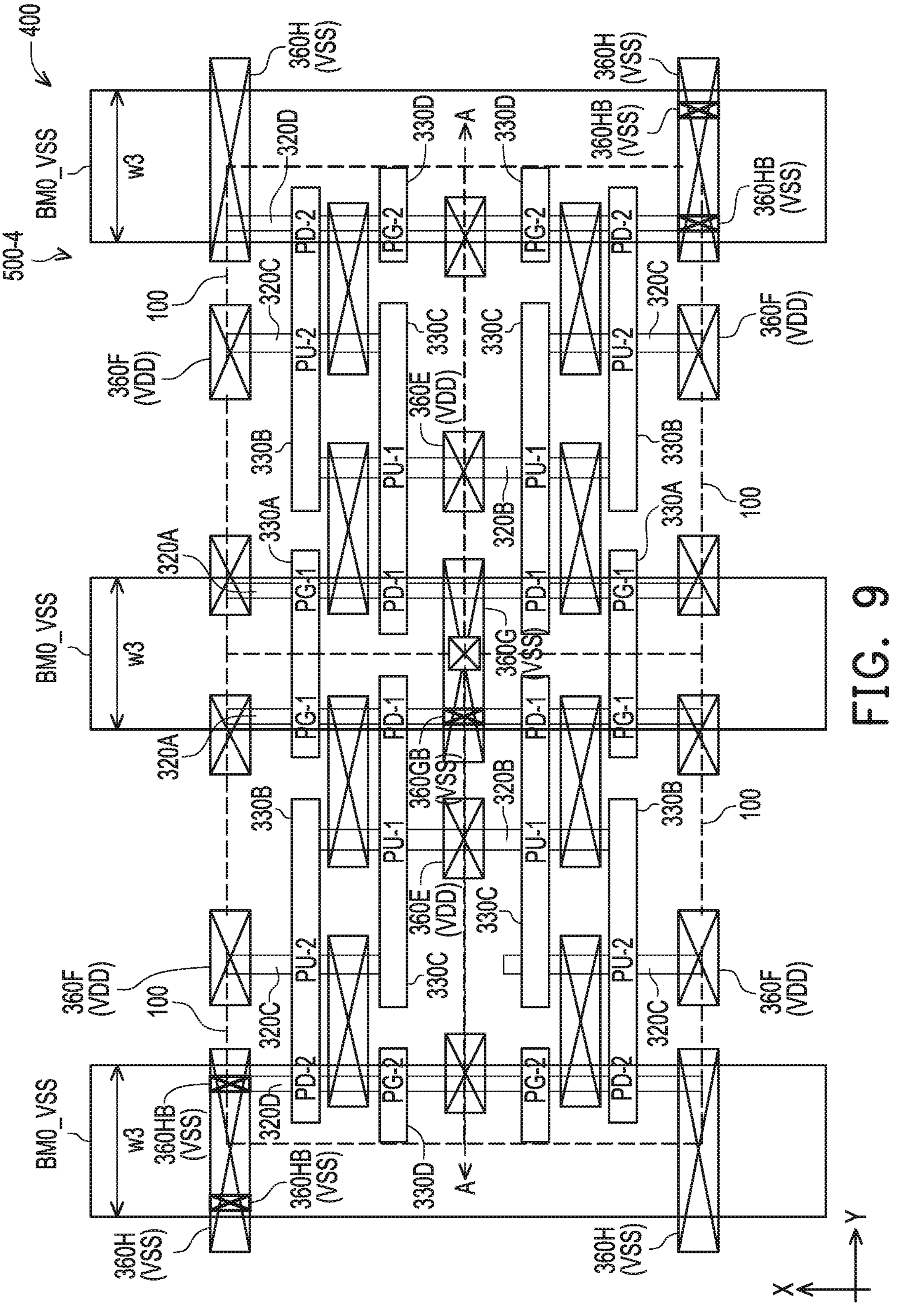

FIG. 9 illustrates a diagrammatic layout 500-4 of a portion of the backside multilayer interconnect structure BMLI of the SRAM array 400, which includes a backside via zero level (BV0 level) and a backside metal zero level (BM0 level). The layout 500-4 is an alternative of the layout 500-2 of FIG. 7. Many aspects of the layout 500-4 are similar to those of the layout 500-2, and the reference numerals are repeated for ease of understanding. One difference is that in the layout 500-4, some of the backside vias are not formed in the BV0 level. Particularly, there are half of the backside vias 360GB and half of the backside vias 360HB not formed in the layout 500-4. For example, there is only one backside via 360GB formed on the backside of the corresponding frontside source/drain contact 360G. The two source/drain contacts 360H positioned at the top-right corner and the lower-left corner have no corresponding backside vias 360HB formed, while the other two source/drain contacts 360H positioned at the top-left corner and the lower-right corner each have corresponding a pair of the backside vias 360HB formed. This configuration reduces the amount of the backside vias electrically coupled to the electrical ground VSS in half, such that a number of the backside vias electrically coupled to the electrical ground VSS equals a number of the frontside source/drain contacts electrically coupled to the electrical ground VSS. The number of the backside metal lines BM0_VSS in the layout 500-4 is the same as in the layout 500-2.

Figure 10A:
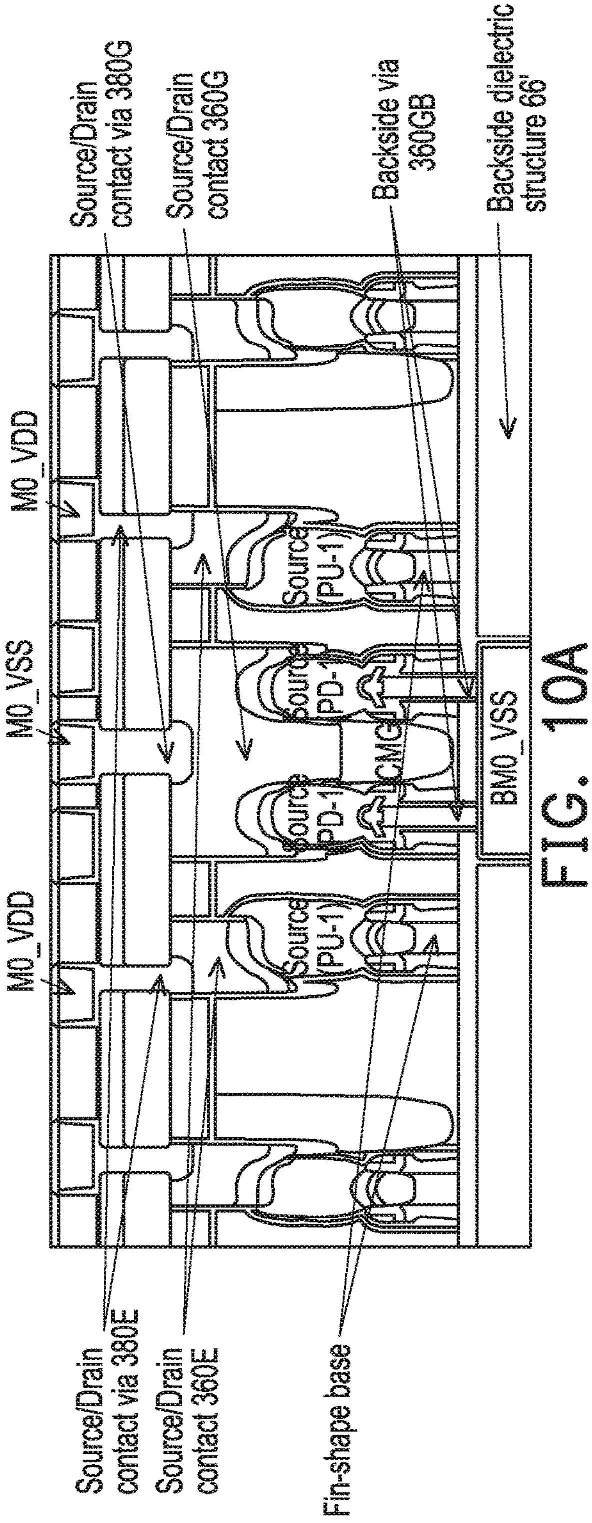
FIGS. 10A and 10B illustrate cross-sectional views of a 2×2 SRAM array, in accordance with some embodiments of the present disclosure.
Figure 10B:
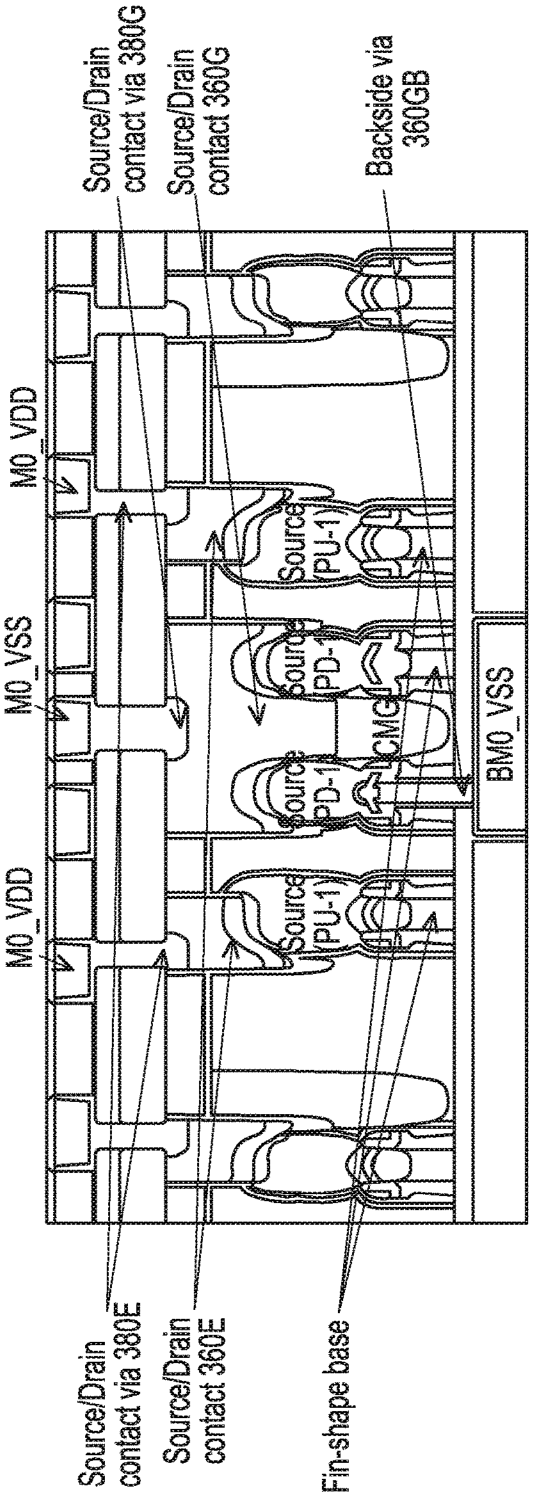

FIG. 10A is a fragmentary diagrammatic cross-sectional view along A-A line of FIG. 7 or FIG. 8, which cuts the source/drain regions across a boundary line between two abutting SRAM cells; FIG. 10B is a fragmentary diagrammatic cross-sectional view along A-A line of FIG. 9, which cuts the source/drain regions across a boundary line between two abutting SRAM cells. As shown in FIG. 10A, the source regions of the pull-down transistors PD-1 of two abutting SRAM cells are interposed by a CMG feature but electrically connected by a source/drain contact 360G on the frontside and two backside vias 360GB on the backside. The source/drain contact 360G and the source/drain contact via 380G landing thereon electrically couple the frontside of the source regions of the two pull-down transistors PD-1 to the metal line M0_VSS which is a part of the frontside power rail for VSS. The two backside vias 360GB electrically connect the backside of the source regions of the two pull-down transistors PD-1 to the backside metal line BM0_VSS which is a part of the backside power rail for VSS. The source regions of the pull-up transistors PU-1 are electrically connected through the source/drain contact 360E and the source/drain contact via 380E landing thereon to the metal line M0_VDD which is a part of the frontside power rail for VDD. As the illustrated embodiment does not have a backside power rail for VDD, the backside of the source regions of the pull-up transistors PU-1 are landing on fin-shape bases which may comprise silicon. Notably, the present disclosure contemplates the backside power rails include either one or both of the backside power rail for VDD and the backside power rail for VSS.

Many aspects of FIG. 10B are similar to those of FIG. 10A, and the reference numerals are repeated for ease of understanding. One difference is that in FIG. 10B, one of the backside vias 360GB is not formed as an effort to reduce a backside via density. Only one of the source regions of the two pull-down transistors PD-1 is directly connected to the backside via 360GB, and the other one of the source regions is landing on a fin-shape base which may comprise silicon. Nonetheless, the other one of the source regions still electrically couples to the backside metal line BM0_VSS through an electrical coupling path that includes the source/drain contact 360G, the adjacent source region, and the backside via 360GB. Therefore, the SRAM cells still benefits from having dual side power rails with extra bonus from a reduced backside via density.

Considering a backside power rail that includes a backside power rail for VSS but no backside power rail for VDD, there are no backside via for the pull-up transistors PU-1 and PU-2. The maximum backside via density is when each source region of the pull-down transistors PD-1 and PD-2 has a corresponding backside via thereunder. Considering a backside power rail that includes a backside power rail for VDD but no backside power rail for VSS, there are no backside via for the pull-down transistors PD-1 and PD-2. The maximum backside via density is when each source region of the pull-up transistors PU-1 and PU-2 has a corresponding backside via thereunder. Considering a backside power rail that includes both a backside power rail for VSS and a backside power rail for VDD, the maximum backside via density is when each source region of the pull-down transistors PD-1 and PD-2 and pull-up transistors PU-1 and PU-2 has a corresponding backside via thereunder. In any of the above configurations, by removing some of the backside vias, the backside via density will drop. Which backside via(s) to remove and which backside via(s) to keep is a consideration of various factors and parameters, including sizes of various conductive features, packing density, resistance of the conductive features, parasitic capacitances among adjacent conductive features, overlay shifting and processing margins.

FIGS. 11-21 illustrate some exemplary embodiments of the arrangement of backside vias. The present disclosure also contemplates other arrangements of backside vias to achieve a reduced backside via density. For reasons of visual clarity and to better understand the inventive concepts of the present disclosure, active regions, gate structures, and backside vias are depicted in FIGS. 11-21, while numerous other features are omitted. Further, only pull-down transistors PD-1 and PD-2 and pull-up transistors PU-1 and PU-2 are marked in the figures, while other transistors are still there but simply not marked. In the embodiments depicted in FIGS. 11-17, the backside vias are all backside vias for VSS; in the embodiment depicted in FIG. 18, the backside vias are all backside vias for VDD; in the embodiments depicted in FIGS. 19-21, the backside vias include both backside vias for VDD and backside vias for VSS.

Figure 11:
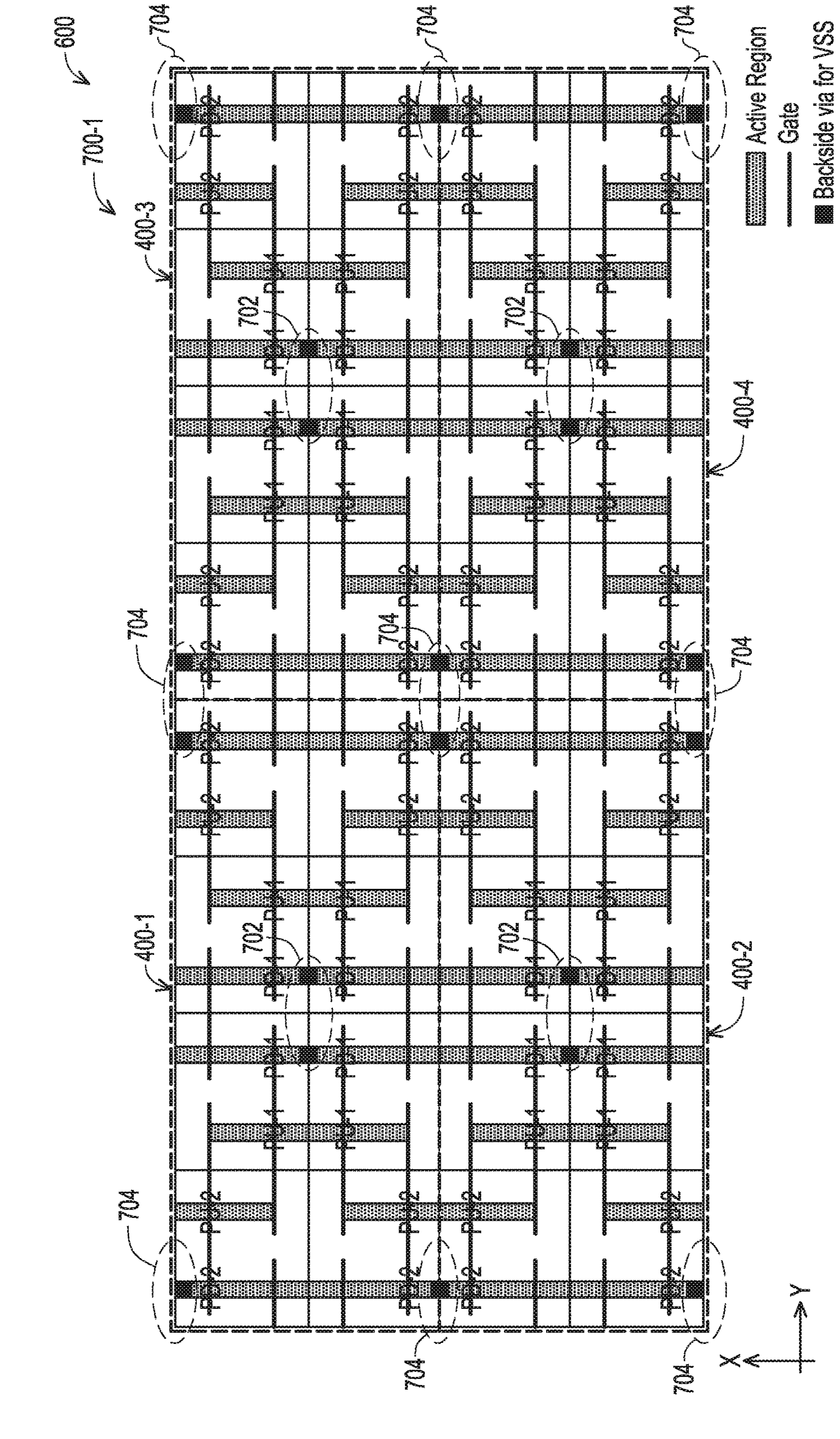
FIGS. 11, 12, 13, 14, 15, 16, 17, 18, 19, 20, and 21 illustrate layouts of backside vias of a 4×4 SRAM array tiled by the 2×2 SRAM array as in FIG. 6 in accordance with some embodiments of the present disclosure.

Reference is now made to FIG. 11. FIG. 11 illustrates a diagrammatic layout 700-1 of an SRAM array 600 according to the present disclosure. Referring to FIG. 11, 16 SRAM cells are arranged in the X-direction and the Y-direction, forming a 4×4 array of SRAM cells. The 4×4 SRAM array can be considered as being constructed with four tiles with each tile based on the 2×2 SRAM array 400 as depicted in FIG. 6. To aid visual clarity, the tiles each including the 2×2 SRAM array 400 are denoted as tiles 400-1, 400-2, 400-3, and 400-4. Two adjacent tiles in the X-direction are line symmetric with respect to a common boundary (represented by broken lines in FIG. 11) therebetween and two adjacent tiles in the Y-direction are line symmetric with respect to a common boundary therebetween. That is, the tile 400-2 is a duplicate tile for the tile 400-1 but flipped over the Y-axis; the tile 400-3 is a duplicate tile for the tile 400-1 but flipped over the X-axis; and the tile 400-4 is a duplicate cell for the tile 400-2 but flipped over the X-axis.

The embodiment as depicted in FIG. 11 has only backside vias for VSS. The backside vias for VSS can be considered as grouped in pairs of two types. The circle 702 highlights the pair of the first type, which is located at a center of a tile. The pair of the first type includes a left backside via positioned underneath a common source region of two pull-down transistors PD-1 and a right backside via positioned underneath a common source region of another two pull-down transistors PD-1. The four pull-down transistors PD-1 are all within the tile. The circle 704 highlights the pair of the second type, which is located at a corner of a tile. The pair of the second type includes a left backside via positioned underneath a common source region of two pull-down transistors PD-2 and a right backside via positioned underneath a common source region of another two pull-down transistors PD-2. The four pull-down transistors PD-2 are from four abutting tiles, respectively. The density of the backside vias for VSS as shown in FIG. 11 is the highest, as each source region for VSS has a corresponding backside via formed underneath.

Figure 12:
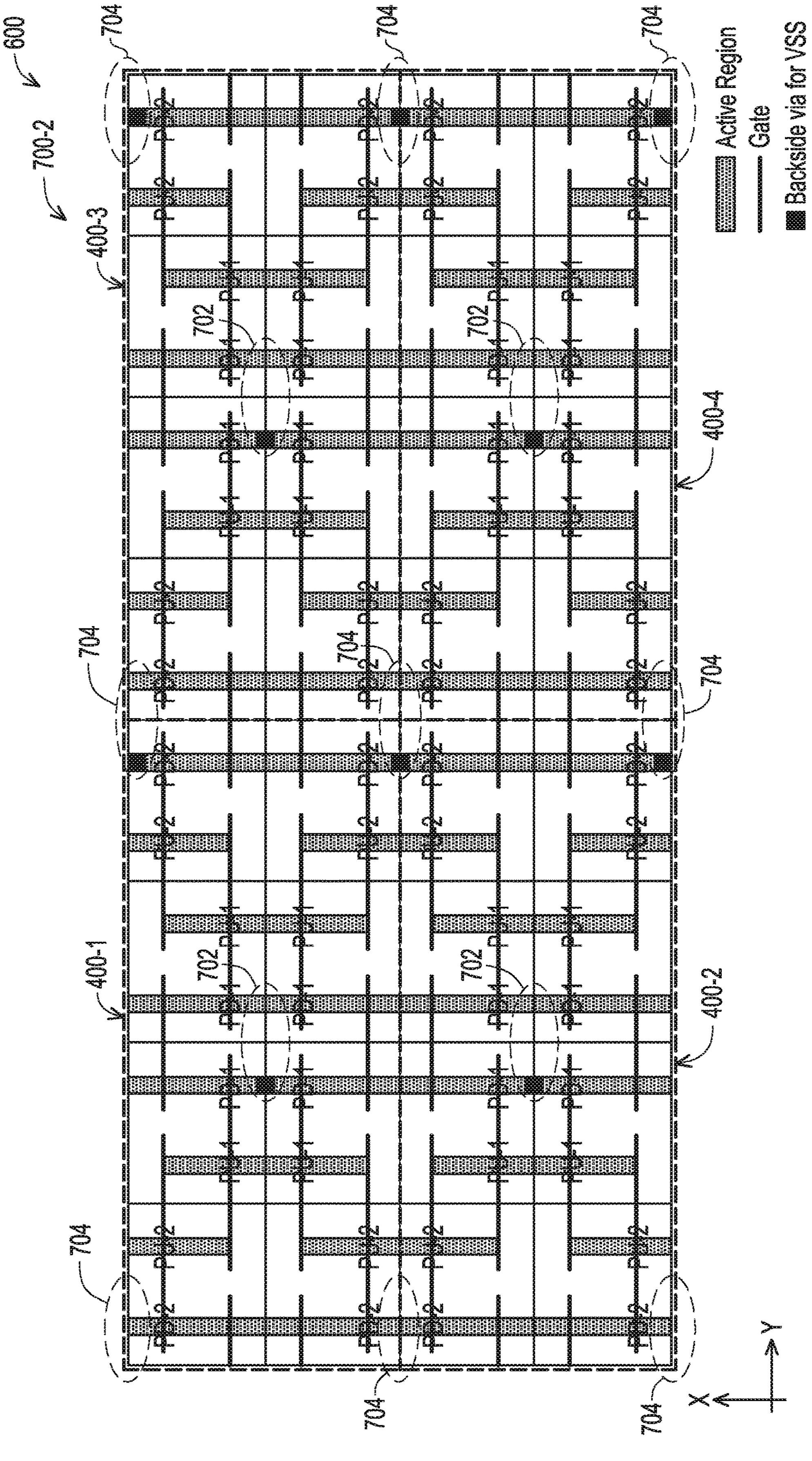

FIG. 12 illustrates a diagrammatic layout 700-2 of an SRAM array 600 according to the present disclosure. Many aspects of the layout 700-2 are similar to those of the layout 700-1, and the reference numerals are repeated for ease of understanding. One difference is that in the layout 700-2, half of the backside vias for VSS are not formed (respective fin-shape bases remain). Particularly, in the pair of the first type (as in the circle 702) and the pair of the second type (as in the circle 704), the right backside via for VSS is not formed and the left backside via for VSS is formed. In such a configuration, the density of the backside vias for VSS is reduced in half compared to that of the layout 700-1.

Figure 13:
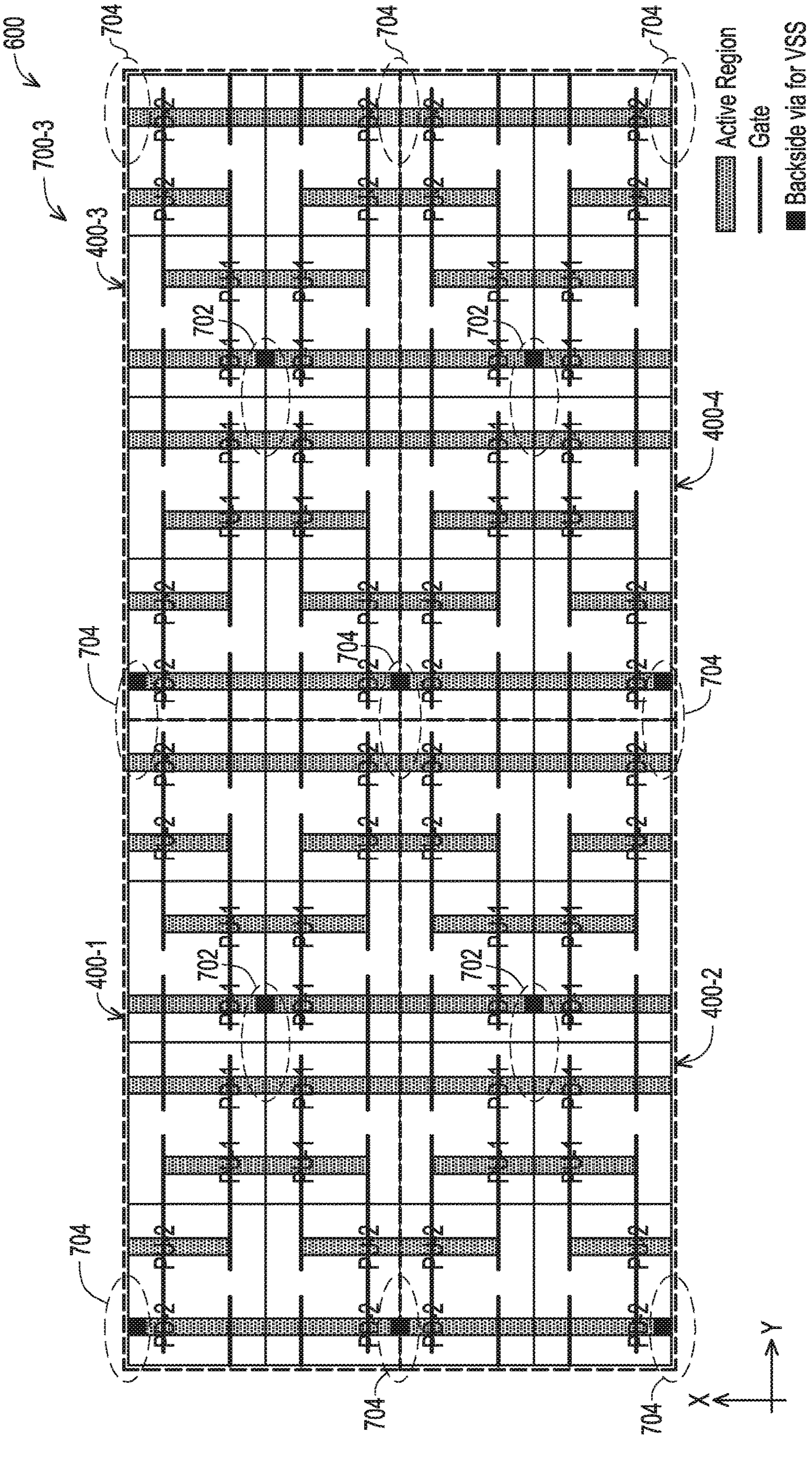

FIG. 13 illustrates a diagrammatic layout 700-3 of an SRAM array 600 according to the present disclosure. Many aspects of the layout 700-3 are similar to those of the layout 700-1, and the reference numerals are repeated for ease of understanding. One difference is that in the layout 700-3, half of the backside vias for VSS are not formed (respective fin-shape bases remain). Particularly, in the pair of the first type (as in the circle 702) and the pair of the second type (as in the circle 704), the left backside via for VSS is not formed and the right backside via for VSS is formed. In such a configuration, the density of the backside vias for VSS is reduced in half compared to that of the layout 700-1.

Figure 14:
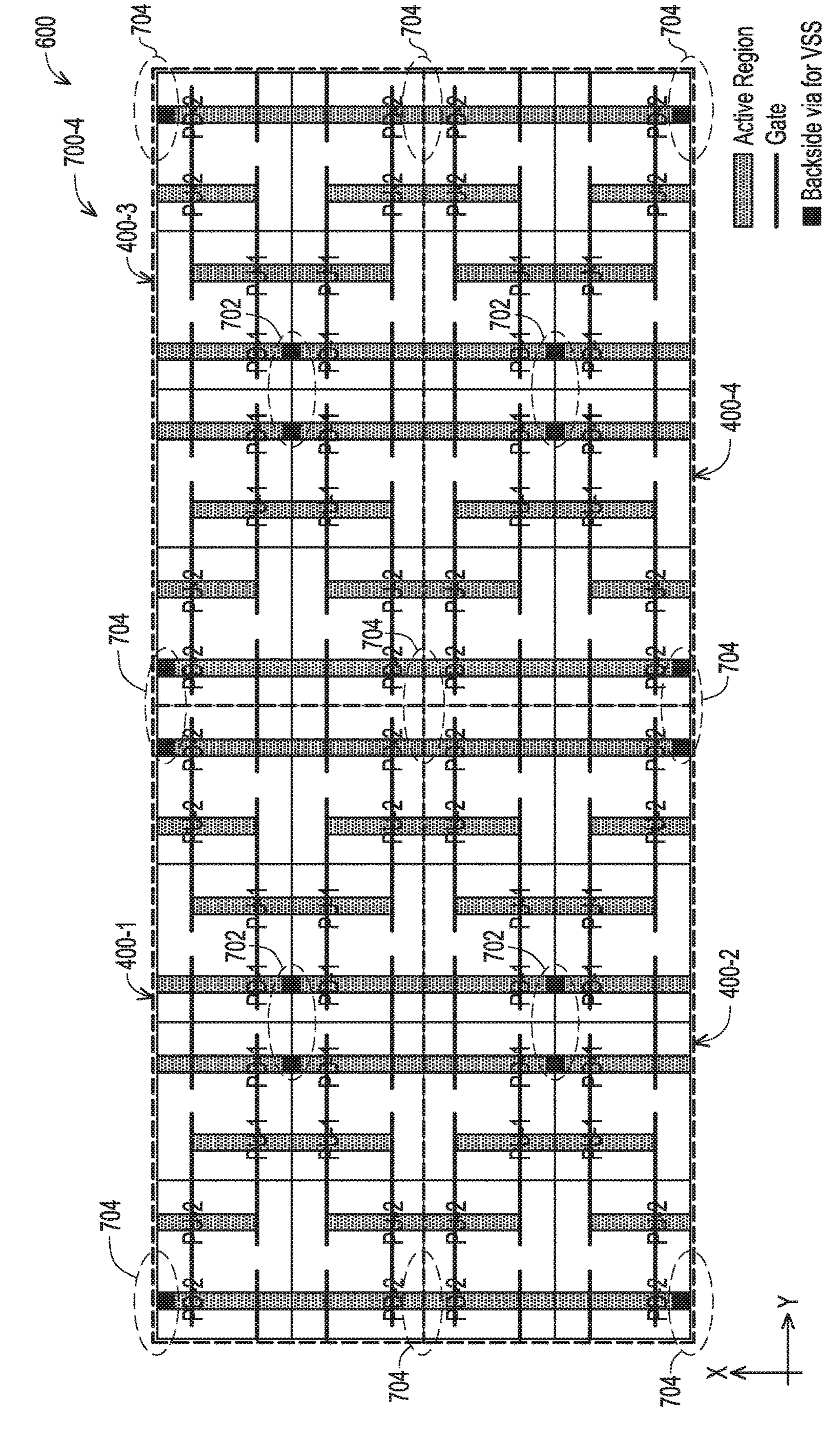

FIG. 14 illustrates a diagrammatic layout 700-4 of an SRAM array 600 according to the present disclosure. Many aspects of the layout 700-4 are similar to those of the layout 700-1, and the reference numerals are repeated for ease of understanding. One difference is that in the layout 700-3, one fourth (¼) of the backside vias for VSS are not formed (respective fin-shape bases remain). Particularly, the two backside vias for VSS in the pairs of the second type (as in the circle 704) that are positioned on the boundary line between the tiles 400-1 and 400-2 and on the boundary line between the tils 400-3 and 400-4 are not formed. While the two backside vias for VSS in other pairs of the second type and in the pairs of the first type (as in the circle 702) are formed. In such a configuration, the density of the backside vias for VSS is about three fourth (¾) of that of the layout 700-1.

Figure 15:
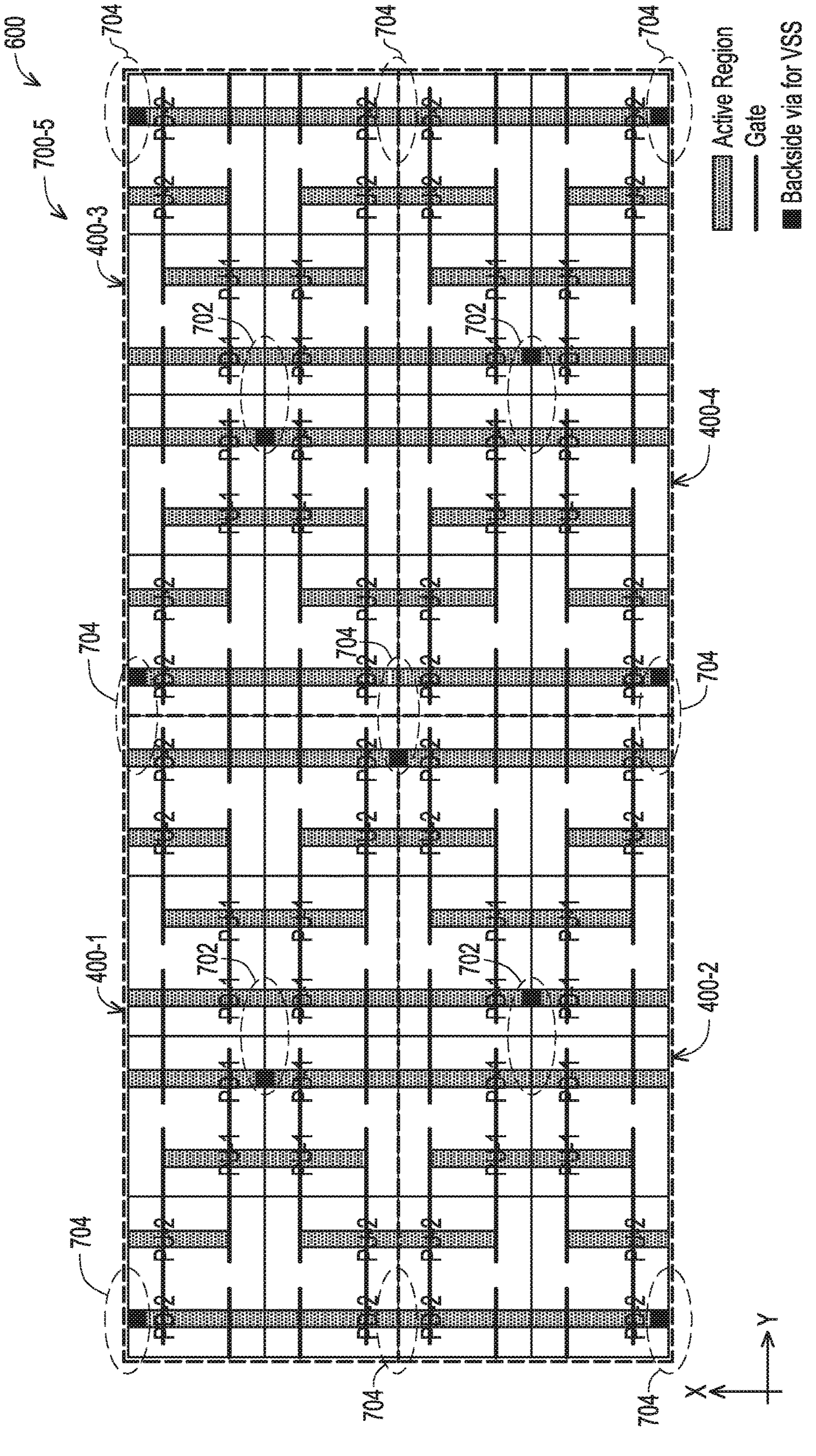

FIG. 15 illustrates a diagrammatic layout 700-5 of an SRAM array 600 according to the present disclosure. Many aspects of the layout 700-5 are similar to those of the layout 700-1, and the reference numerals are repeated for ease of understanding. One difference is that in the layout 700-3, half of the backside vias for VSS are not formed (respective fin-shape bases remain). Particularly, in the pair of the first type (as in the circle 702) and the pair of the second type (as in the circle 704), either the left backside via for VSS or the right backside via for VSS is not formed. Further, in the same column, the pairs of the same type have alternating ones of the backside via for VSS not formed. For example, the pair of the first type (as in the circle 702) in the tile 400-1 has the right backside via for VSS not formed, and the pair of the first type in the tile 400-2 has the alternating one, the left one, not formed. Similarly, the pairs of the second type (as in the circle 704) in the middle of the SRAM array 600 has the top pair with the left backside via not formed, the middle pair with the right backside via not formed, and the bottom pair with the left backside via not formed. In such a configuration, the density of the backside vias for VSS is reduced in half compared to that of the layout 700-1.

Figure 16:
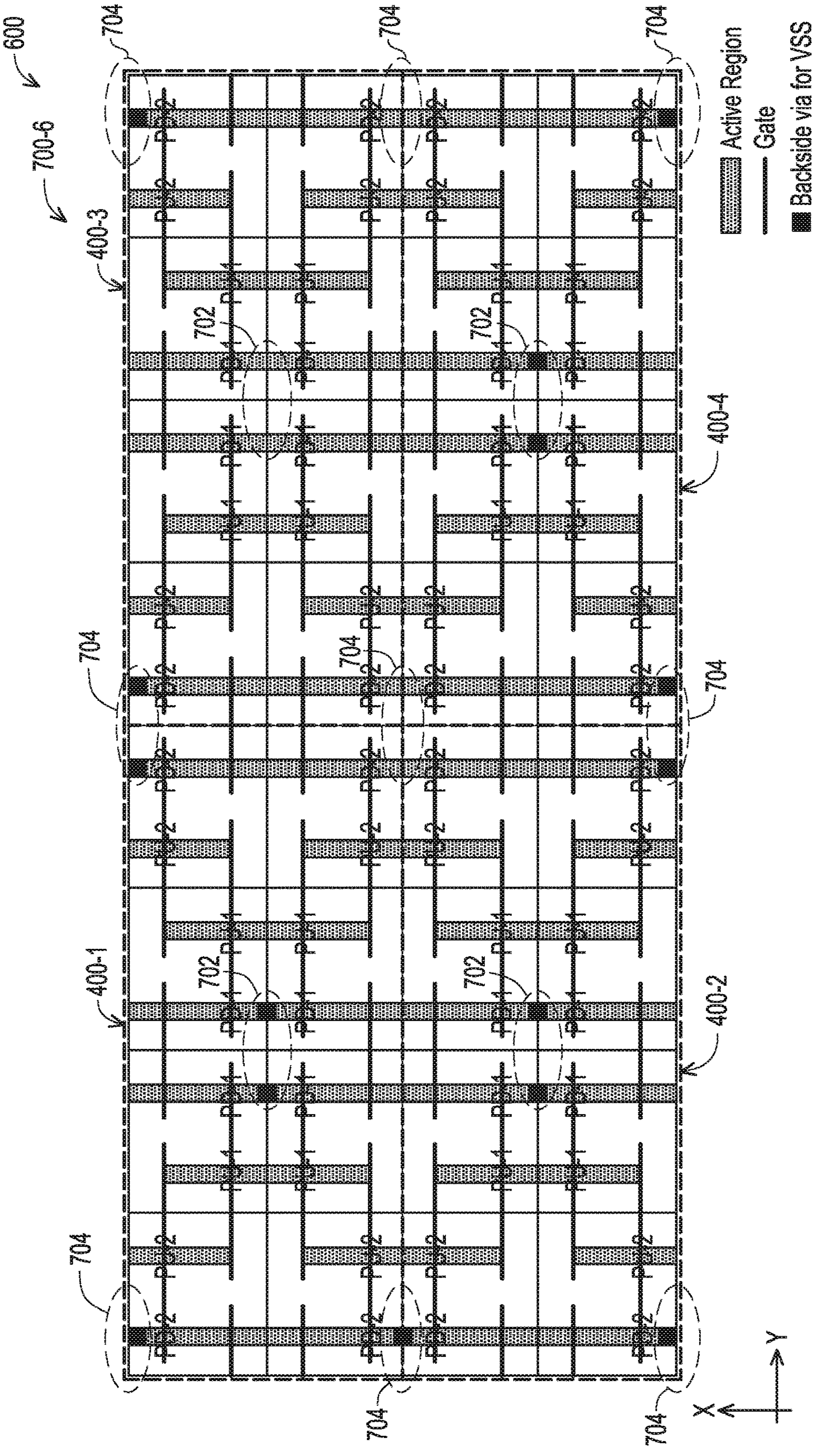

FIG. 16 illustrates a diagrammatic layout 700-6 of an SRAM array 600 according to the present disclosure. Many aspects of the layout 700-6 are similar to those of the layout 700-1, and the reference numerals are repeated for ease of understanding. One difference is that in the layout 700-6, some of the backside vias for VSS are not formed (respective fin-shape bases remain). Particularly, the pairs of the first type and the second type are more randomly removed. For example, in the middle of the tile 400-3, the pair of the first type (as in the circle 702), including two backside vias for VSS, is not formed, while some other pairs of the first type may remain. Similarly, in the middle of the array 600, the pair of the second type (as in the circle 704), including two backside vias for VSS, is not formed, while some other pairs of the second type may remain.

Figure 17:
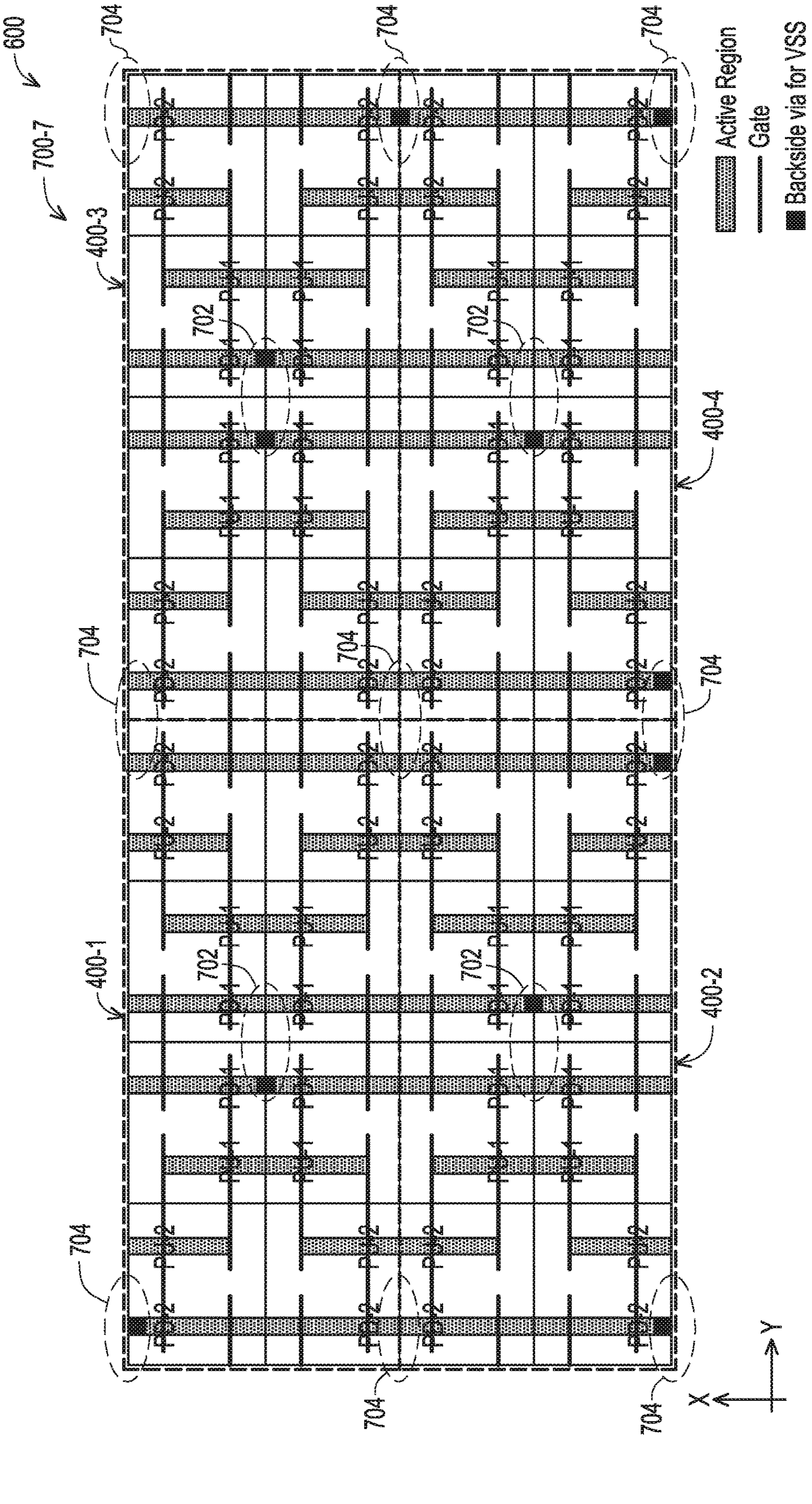

FIG. 17 illustrates a diagrammatic layout 700-7 of an SRAM array 600 according to the present disclosure. Many aspects of the layout 700-7 are similar to those of the layout 700-1, and the reference numerals are repeated for ease of understanding. One difference is that in the layout 700-7, some of the backside vias for VSS are not formed (respective fin-shape bases remain). Particularly, the backside vias for VSS are more randomly removed from the pairs of the first and second types. For example, in the pair of the first type (as in the circle 702) positioned in the middle of the tile 400-3, the two backside vias for VSS both remain, while other pairs of the first type in other tiles have one backside via for VSS removed. Also, some pairs of the second type (as in the circle 704) are removed, while other pairs of the second type may remain.

Figure 18:
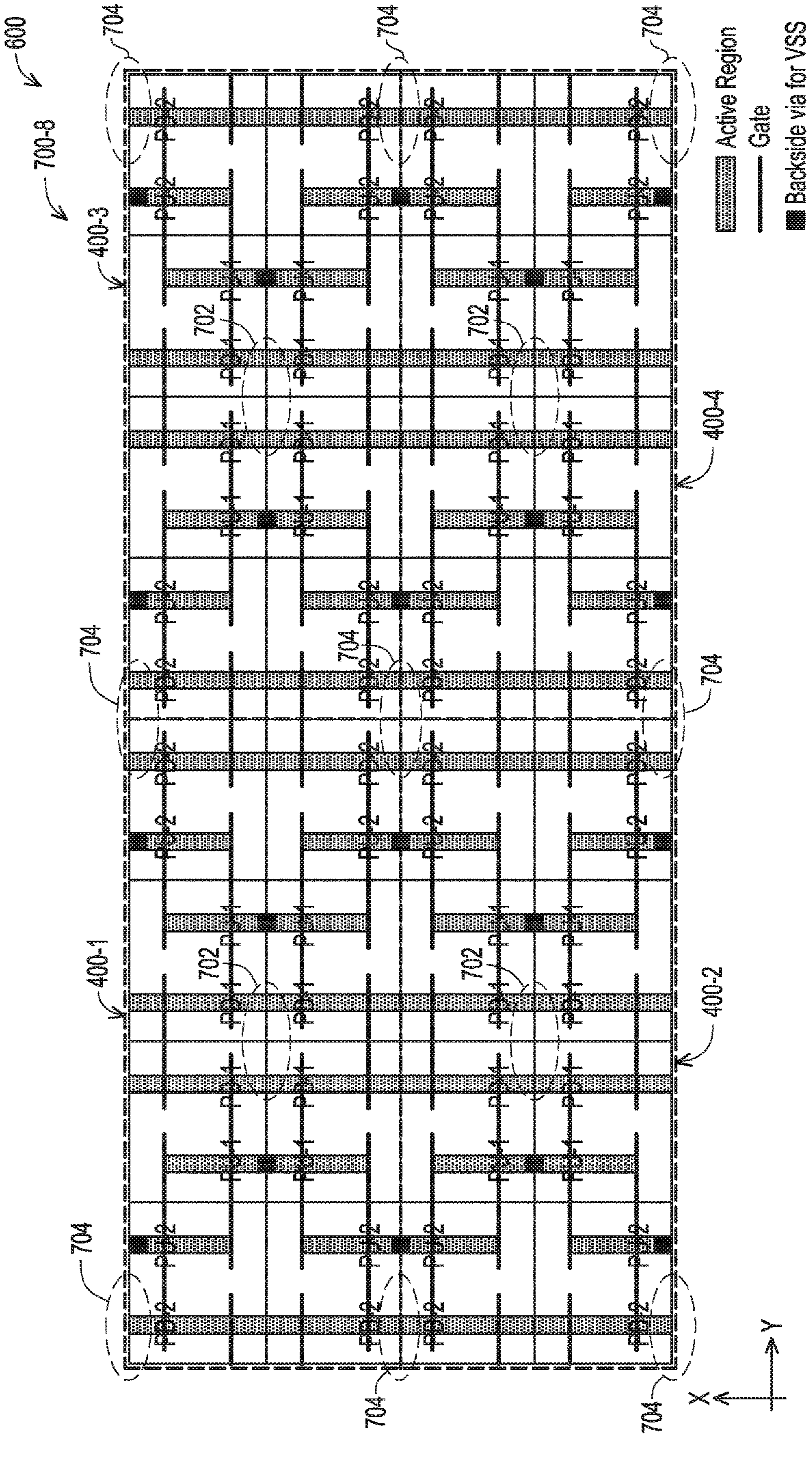

FIG. 18 illustrates a diagrammatic layout 700-8 of an SRAM array 600 according to the present disclosure. Many aspects of the layout 700-8 are similar to those of the layout 700-1, and the reference numerals are repeated for ease of understanding. One difference is that in the layout 700-8, only backside vias for VDD are formed. There is no backside via for VSS formed. The density of the backside vias for VDD in FIG. 18 is the highest, as each source region for VDD has a corresponding backside via formed underneath.

Figure 19:
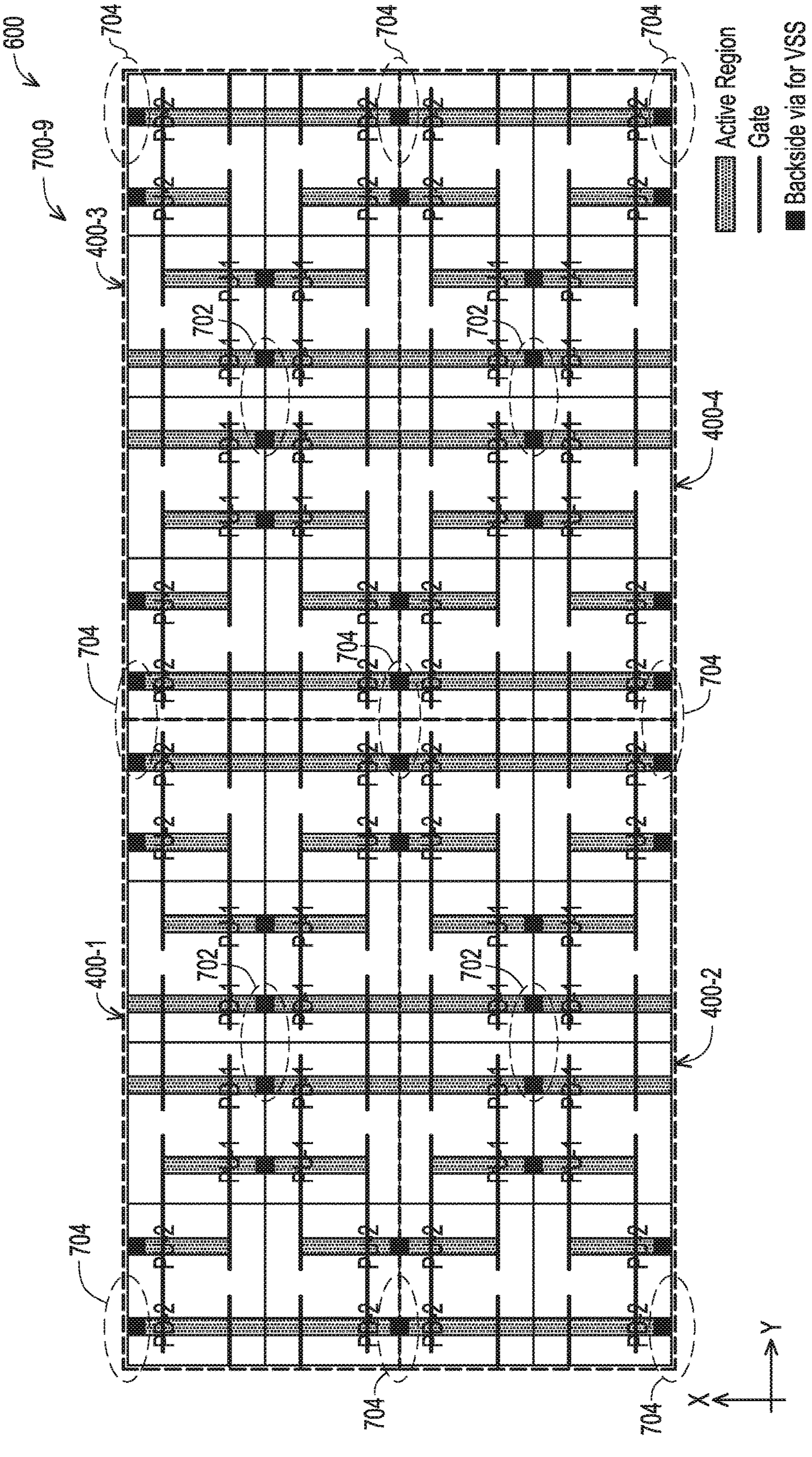

FIG. 19 illustrates a diagrammatic layout 700-9 of an SRAM array 600 according to the present disclosure. Many aspects of the layout 700-9 are similar to those of the layout 700-1, and the reference numerals are repeated for ease of understanding. One difference is that in the layout 700-9, besides the backside vias for VSS, the backside vias for VDD are also formed underneath each common source region of two adjacent pull-up transistors PU-1 and PU-2. Particularly, two backside vias for VDD sandwich a pair of two backside vias for VSS along the Y-direction. The density of the backside vias for VSS and VDD collectively as in FIG. 19 is the highest, as each source region for either VSS or VDD has a corresponding backside via formed underneath.

Figure 20:
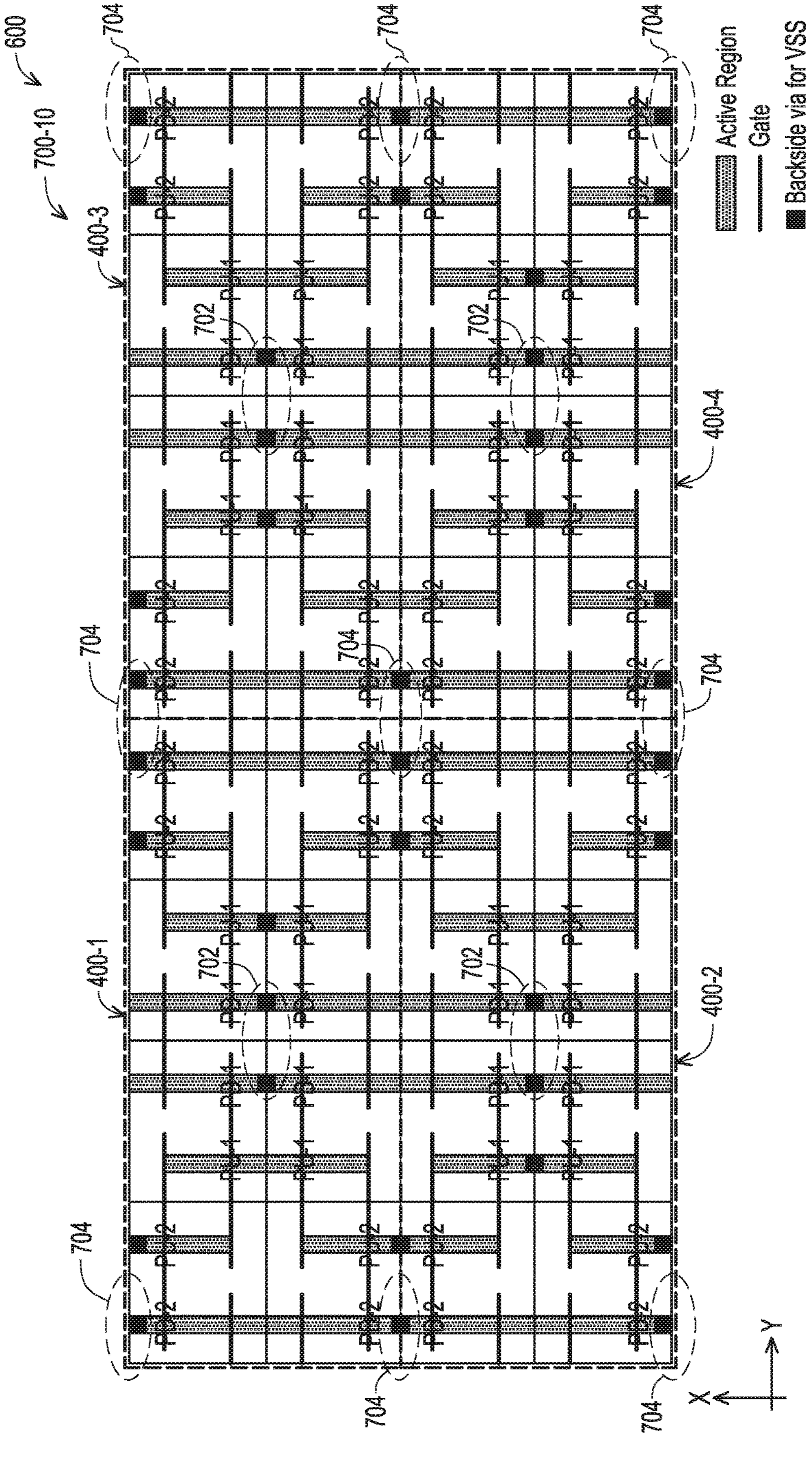

FIG. 20 illustrates a diagrammatic layout 700-10 of an SRAM array 600 according to the present disclosure. Many aspects of the layout 700-10 are similar to those of the layout 700-9, and the reference numerals are repeated for ease of understanding. One difference is that in the layout 700-10, some of the backside vias for VDD are not formed (respective fin-shape bases remain) and all the backside vias for VSS remain. A pair of the backside vias for VSS may still have one adjacent backside via for VDD remaining in the row and another backside via for VDD not formed. In such a configuration, the density of the backside vias for VSS and VDD collectively as in FIG. 20 is reduced compared to that of the layout 700-9.

Figure 21:
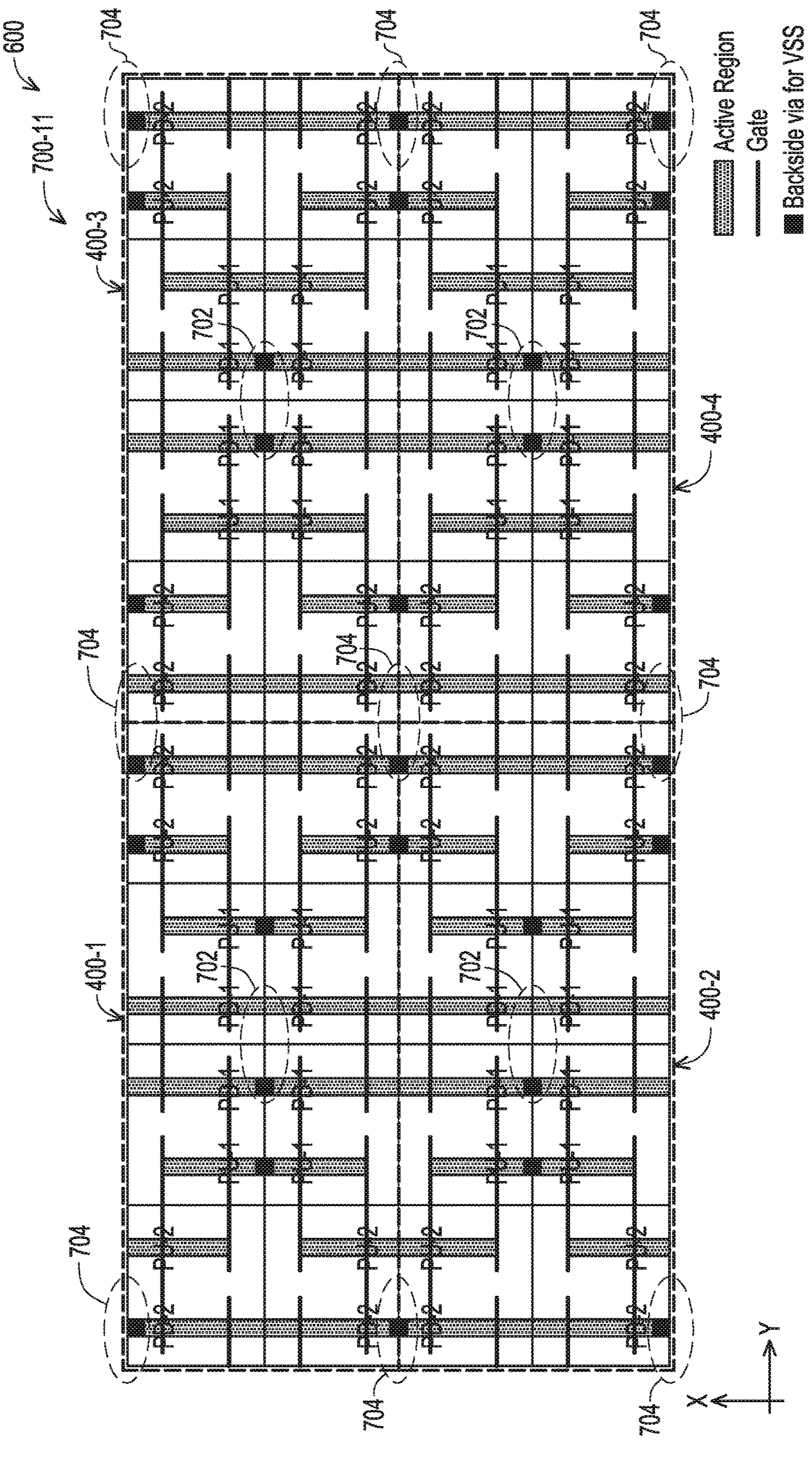

FIG. 21 illustrates a diagrammatic layout 700-11 of an SRAM array 600 according to the present disclosure. Many aspects of the layout 700-11 are similar to those of the layout 700-9, and the reference numerals are repeated for ease of understanding. One difference is that in the layout 700-11, some of the backside vias for VDD and some of the backside vias for VSS are not formed (respective fin-shape bases remain). Particularly, the backside vias for VSS and the backside vias for VDD are more randomly removed. For example, in a row of the two backside vias for VDD sandwiching the pair of the backside vias for VSS, there may be one backside via for VDD removed, or there may be both backside vias for VDD removed, or there may be one backside via for VSS removed. In such a configuration, the density of the backside vias for VSS and VDD collectively as in FIG. 21 is reduced compared to that of the layout 700-9.

The SRAM cells and the corresponding layouts illustrated in various exemplary embodiments of the present disclosure provide backside vias with a reduced backside via density. The reduced backside via density effectively reduces mask costs and enlarges process window. Further, embodiments of the present disclosure can be readily integrated into existing semiconductor manufacturing processes.

In one exemplary aspect, the present disclosure is directed to a memory cell. The memory cell includes first and second active regions each extending lengthwise along a first direction, first and second gate structures each extending lengthwise along a second direction perpendicular to the first direction, the first gate structure engaging the first active region in forming a first transistor, the second gate structure engaging the second active region in forming a second transistor, and the first and second transistors having a same conductivity type, a first epitaxial feature disposed on a source region of the first transistor, a second epitaxial feature disposed on a source region of the second transistor, a first frontside contact directly above and in electrical coupling with the first epitaxial feature, a second frontside contact directly above and in electrical coupling with the second epitaxial feature, and a first backside via directly under and in electrical coupling with one of the first and second epitaxial features, another one of the first and second epitaxial features being free of a backside via directly thereunder and in electrical coupling therewith. In some embodiments, the first transistor is a first pull-down transistor of the memory cell, and the second transistor is a second pull-down transistor of the memory cell. In some embodiments, the first backside via electrically couples to an electrical ground of the memory cell. In some embodiments, the first transistor is a first pull-up transistor of the memory cell, and the second transistor is a second pull-up transistor of the memory cell. In some embodiments, the first backside via electrically couples to a power supply of the memory cell. In some embodiments, the memory cell also includes a third active region extending lengthwise along the first direction, the first gate structure engaging the third active region in forming a third transistor, and the third transistor having a different conductivity type from the first and second transistors, a third epitaxial feature disposed on a source region of the third transistor, and a second backside via directly under and in electrical coupling with the third epitaxial feature. In some embodiments, the first and second transistors are n-type transistors, the third transistor is a p-type transistor, the first backside via electrically couples to an electrical ground of the memory cell, and the second backside via electrically couples to a power supply of the memory cell. In some embodiments, the first and second transistors are p-type transistors, the third transistor is an n-type transistor, the first backside via electrically couples to a power supply of the memory cell, and the second backside via electrically couples to an electrical ground of the memory cell. In some embodiments, the memory cell also includes first and second frontside metal lines each extending lengthwise along the first direction, a first frontside contact via disposed vertically between the first frontside contact and the first frontside metal line and electrically connecting the first frontside contact to the first frontside metal line, a second frontside contact via disposed vertically between the second frontside contact and the second frontside metal line and electrically connecting the second frontside contact to the second frontside metal line, and a first backside metal line extending lengthwise along the first direction and in physical contact with the first backside via. In some embodiments, the first backside metal line is wider than the first frontside metal line and the second frontside metal line.

In another exemplary aspect, the present disclosure is directed to a semiconductor structure. The semiconductor structure includes first and second active regions extending lengthwise along a first direction, a gate stack extending lengthwise along a second direction perpendicular to the first direction, a dielectric feature extending lengthwise along the first direction and disposed between the first and second active regions, the dielectric feature dividing the gate stack into a first segment over the first active region and a second segment over the second active region, a first epitaxial feature disposed on the first active region, a second epitaxial feature disposed on the second active region, the first and second epitaxial features being disposed on two opposing sides of the dielectric feature, a frontside conductive feature directly above and in physical contact with top surfaces of the first and second epitaxial features, a backside conductive feature directly under and in physical contact with a bottom surface of the first epitaxial feature, and a semiconductor base directly under and in physical contact with a bottom surface of the second epitaxial feature. In some embodiments, each of the frontside conductive feature and the backside conductive feature electrically couples to an electrical ground of the semiconductor structure. In some embodiments, the semiconductor structure also includes a frontside via landing on the frontside conductive feature, a frontside metal line directly above and in physical contact with the frontside via, and a backside metal line directly under and in physical contact with the backside conductive feature. In some embodiments, the backside metal line is wider than the frontside metal line. In some embodiments, the first segment of the gate stack and the first active region form a pull-down transistor of a first memory cell, and the second segment of the gate stack and the second active region form a pull-down transistor of a second memory cell abutting the first memory cell.

In yet another exemplary aspect, the present disclosure is directed to a memory array. The memory array includes a first memory cell and a second memory cell abutting the first memory cell, the first memory cell including a first pull-up transistor and a first pull-down transistor, and the second memory cell including a second pull-up transistor and a second pull-down transistor, a third memory cell and a fourth memory cell abutting the third memory cell, the third memory cell abutting the first memory cell, the fourth memory cell abutting the second memory cell, the third memory cell including a third pull-up transistor and a third pull-down transistor, and the fourth memory cell including a fourth pull-up transistor and a fourth pull-down transistor, a first common source region of the first and second pull-up transistors, a second common source region of the first and second pull-down transistors, a third common source region of the third and fourth pull-down transistors, a fourth common source region of the third and fourth pull-up transistors, and a plurality of source region backside vias, each of the source region backside vias being directly under one of the first, second, third, and fourth common source regions, and at least one of the first, second, third, and fourth common source regions being free of a source region backside via disposed directly thereunder. In some embodiments, the plurality of source region backside vias are directly under the second and third common source regions, and each of the first and fourth common source regions is free of a source region backside vias disposed directly thereunder. In some embodiments, the plurality of source region backside vias are directly under the first and fourth common source regions, and each of the second and third common source regions is free of a source region backside via disposed directly thereunder. In some embodiments, the plurality of source region backside vias are directly under the first, second, and fourth common source regions, and the third common source region is free of a source region backside via disposed directly thereunder. In some embodiments, the plurality of source region backside vias are directly under the first, second, and third common source regions, and the fourth common source region is free of a source region backside via disposed directly thereunder.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory cell, comprising:

first and second active regions each extending lengthwise along a first direction;

first and second gate structures each extending lengthwise along a second direction perpendicular to the first direction, wherein the first gate structure engages the first active region in forming a first transistor, the second gate structure engages the second active region in forming a second transistor, and the first and second transistors have a same conductivity type;

a first source/drain epitaxial feature disposed on a source region of the first transistor;

a second source/drain epitaxial feature disposed on a source region of the second transistor;

a first frontside contact directly above and in electrical coupling with the first source/drain epitaxial feature;

a second frontside contact directly above and in electrical coupling with the second source/drain epitaxial feature; and a first backside via interfacing and in electrical coupling with a bottom surface of one of the first and second source/drain epitaxial features, wherein another one of the first and second source/drain epitaxial features is free of a backside via interfacing and in electrical coupling therewith.

2. The memory cell of claim 1, wherein the first transistor is a first pull-down transistor of the memory cell, and the second transistor is a second pull-down transistor of the memory cell.

3. The memory cell of claim 2, wherein the first backside via electrically couples to an electrical ground of the memory cell.

4. The memory cell of claim 1, wherein the first transistor is a first pull-up transistor of the memory cell, and the second transistor is a second pull-up transistor of the memory cell.

5. The memory cell of claim 4, wherein the first backside via electrically couples to a power supply of the memory cell.

6. The memory cell of claim 1, further comprising:

a third active region extending lengthwise along the first direction, wherein the first gate structure engages the third active region in forming a third transistor, and the third transistor has a different conductivity type from the first and second transistors;

a third source/drain epitaxial feature disposed on a source region of the third transistor; and a second backside via directly under and in electrical coupling with the third source/drain epitaxial feature.

7. The memory cell of claim 6, wherein the first and second transistors are n-type transistors, the third transistor is a p-type transistor, the first backside via electrically couples to an electrical ground of the memory cell, and the second backside via electrically couples to a power supply of the memory cell.

8. The memory cell of claim 6, wherein the first and second transistors are p-type transistors, the third transistor is an n-type transistor, the first backside via electrically couples to a power supply of the memory cell, and the second backside via electrically couples to an electrical ground of the memory cell.

9. The memory cell of claim 1, further comprising:

first and second frontside metal lines each extending lengthwise along the first direction;

a first frontside contact via disposed vertically between the first frontside contact and the first frontside metal line and electrically connecting the first frontside contact to the first frontside metal line;

a second frontside contact via disposed vertically between the second frontside contact and the second frontside metal line and electrically connecting the second frontside contact to the second frontside metal line; and a first backside metal line extending lengthwise along the first direction and in physical contact with the first backside via.

10. The memory cell of claim 9, wherein the first backside metal line is wider than the first frontside metal line and the second frontside metal line.

11. A semiconductor structure, comprising:

first and second active regions extending lengthwise along a first direction;

a gate stack extending lengthwise along a second direction perpendicular to the first direction;

a dielectric feature extending lengthwise along the first direction and disposed between the first and second active regions, wherein the dielectric feature divides the gate stack into a first segment over the first active region and a second segment over the second active region, wherein the dielectric feature abutting sidewalls of the first and second segments;

a first source/drain epitaxial feature disposed on the first active region;

a second source/drain epitaxial feature disposed on the second active region, wherein the first and second source/drain epitaxial features are disposed on two opposing sides of the dielectric feature;

a frontside conductive feature directly above and in physical contact with top surfaces of the first and second source/drain epitaxial features;

a backside conductive feature directly under and in physical contact with a bottom surface of the first source/drain epitaxial feature; and a semiconductor base directly under and in physical contact with a bottom surface of the second source/drain epitaxial feature.

12. The semiconductor structure of claim 11, wherein each of the frontside conductive feature and the backside conductive feature electrically couples to an electrical ground of the semiconductor structure.

13. The semiconductor structure of claim 11, further comprising:

a frontside via landing on the frontside conductive feature;

a frontside metal line directly above and in physical contact with the frontside via; and a backside metal line directly under and in physical contact with the backside conductive feature.

14. The semiconductor structure of claim 13, wherein the backside metal line is wider than the frontside metal line.

15. The semiconductor structure of claim 11, wherein the first segment of the gate stack and the first active region form a pull-down transistor of a first memory cell, and the second segment of the gate stack and the second active region form a pull-down transistor of a second memory cell abutting the first memory cell.

16. A memory array, comprising:

a first memory cell and a second memory cell abutting the first memory cell, wherein the first memory cell includes a first pull-up transistor and a first pull-down transistor, and the second memory cell includes a second pull-up transistor and a second pull-down transistor;

a third memory cell and a fourth memory cell abutting the third memory cell, wherein the third memory cell abuts the first memory cell, the fourth memory cell abuts the second memory cell, the third memory cell includes a third pull-up transistor and a third pull-down transistor, and the fourth memory cell includes a fourth pull-up transistor and a fourth pull-down transistor;

a first common source region of the first and second pull-up transistors;

a second common source region of the first and second pull-down transistors;

a third common source region of the third and fourth pull-down transistors;

a fourth common source region of the third and fourth pull-up transistors;

a source region frontside contact overlapping with the first, second, third, and fourth memory cells when viewed from top and electrically coupled to the second and third common source regions; and a plurality of source region backside vias, wherein each of the source region backside vias is directly under one of the first, second, third, and fourth common source regions, and at least one of the first, second, third, and fourth common source regions is free of a source region backside via disposed directly thereunder.

17. The memory array of claim 16, wherein the plurality of source region backside vias are directly under the second and third common source regions, and each of the first and fourth common source regions is free of a source region backside vias disposed directly thereunder.

18. The memory array of claim 16, wherein the plurality of source region backside vias are directly under the first and fourth common source regions, and each of the second and third common source regions is free of a source region backside via disposed directly thereunder.

19. The memory array of claim 16, wherein the plurality of source region backside vias are directly under the first, second, and fourth common source regions, and the third common source region is free of a source region backside via disposed directly thereunder.

20. The memory array of claim 16, wherein the plurality of source region backside vias are directly under the first, second, and third common source regions, and the fourth common source region is free of a source region backside via disposed directly thereunder.

* * * * *